United States Patent
Tamura et al.

(10) Patent No.: US 8,410,498 B2
(45) Date of Patent: Apr. 2, 2013

(54) SEMICONDUCTOR LIGHT EMITTING DEVICE AND METHOD FOR MANUFACTURING THE SAME

(75) Inventors: Wataru Tamura, Tokyo (JP); Chiharu Sasaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 432 days.

(21) Appl. No.: 12/779,246

(22) Filed: May 13, 2010

(65) Prior Publication Data
US 2010/0289042 A1    Nov. 18, 2010

(30) Foreign Application Priority Data
May 14, 2009   (JP) .................................. 2009-117500

(51) Int. Cl.
*H01L 33/00* (2010.01)
(52) U.S. Cl. .......................................... 257/96; 438/47
(58) Field of Classification Search .................... 257/96; 438/47
See application file for complete search history.

(56) References Cited

U.S. PATENT DOCUMENTS

| 5,777,349 A | 7/1998 | Nakamura et al. |
| 5,814,838 A * | 9/1998 | Ohtsuka et al. ................. 257/94 |
| 6,468,818 B2 * | 10/2002 | Nakamura et al. ............. 438/22 |

FOREIGN PATENT DOCUMENTS

| JP | 9-260724 A | 10/1997 |
| JP | 2004-304090 A | 10/2004 |

* cited by examiner

*Primary Examiner* — Shaun Campbell
(74) *Attorney, Agent, or Firm* — Holtz, Holtz, Goodman & Chick, P.C.

(57) ABSTRACT

A semiconductor light emitting device includes a first cladding layer, a second cladding layer, and an active layer formed between the first and second cladding layers. A diffusion control layer includes an intermediate layer and a first transparent conductive layer provided on the second cladding layer in this order. The semiconductor light emitting device further includes a second transparent conductive layer having an impurity in a concentration lower than an impurity concentration of the diffusion control layer, and a third transparent conductive layer having an impurity in a concentration higher than the impurity concentration of the second transparent conductive layer. The boundary between the intermediate layer and the first transparent conductive layer is a lattice mismatch interface.

27 Claims, 23 Drawing Sheets

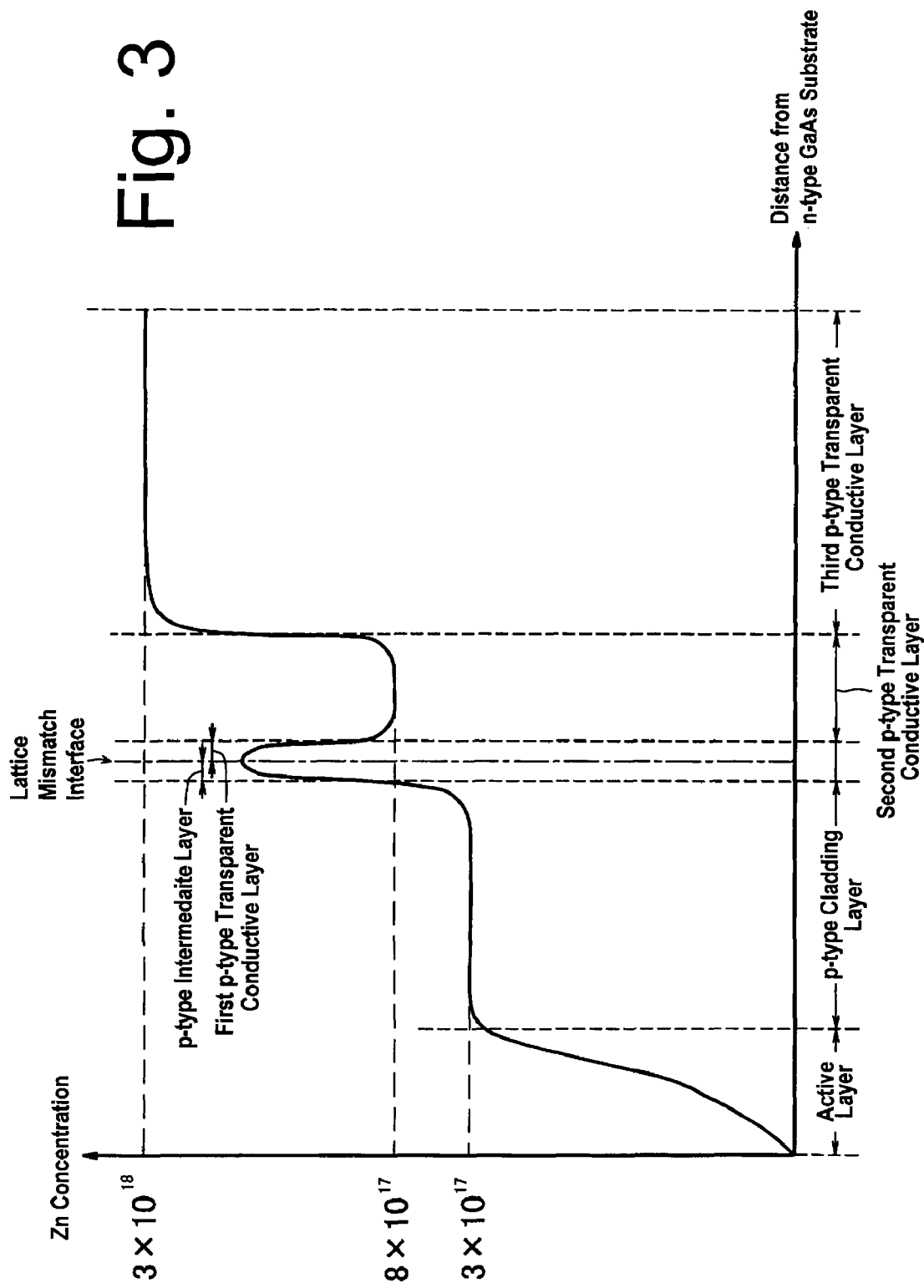

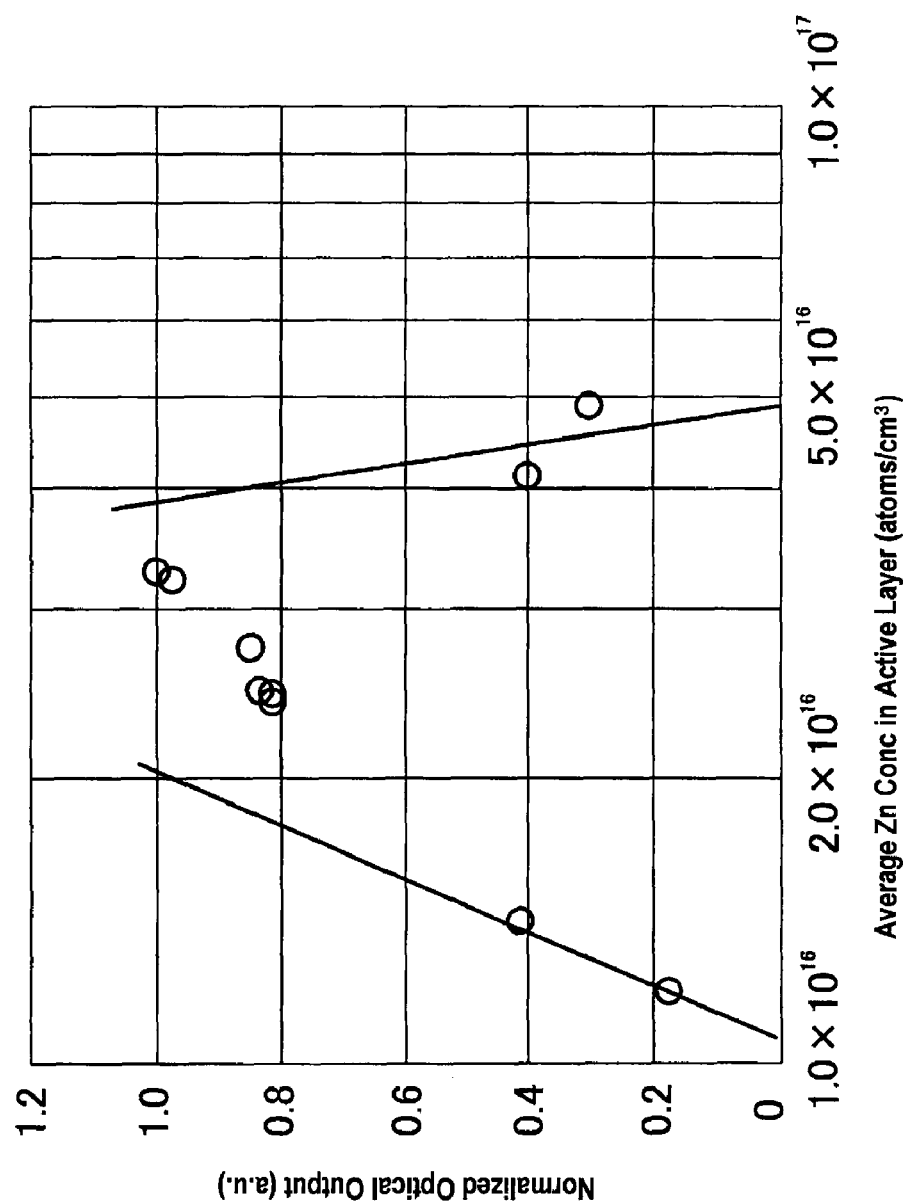

Fig. 21

| | |
|---|---|
| Semiconductor Growth Layer | ~214 |
| AuZn | ~215 |
| TaN | ~216 |
| TiW | ~217 |
| TaN | ~218 |
| AuSnNi | ~231 |
| Ni | ~205 |
| Ti | ~204 |
| Pt | ~203 |
| Si | ~201 |
| Pt | ~202 |

SEMICONDUCTOR LIGHT EMITTING DEVICE AND METHOD FOR MANUFACTURING THE SAME

CROSS-REFERENCE TO RELATED APPLICATION

This application claims the priority benefit under 35 U.S.C. §119 of Japanese Patent Application No. 2009-117500 filed on May 14, 2009, which is hereby incorporated in its entirety by reference.

BACKGROUND OF THE INVENTION

1. Field of the Invention

The present invention relates to a semiconductor light emitting device. In particular, the present invention relates to a semiconductor light emitting device manufactured by utilizing a technique of stacking a plurality of semiconductor layers on a semiconductor substrate.

2. Description of the Related Art

Methods are known for fabricating a semiconductor light emitting device by stacking a plurality of semiconductor layers on a GaAs substrate, serving as a growth substrate, utilizing an MOCVD (metal organic chemical vapor deposition) method. For example, on a GaAs substrate, an n-type cladding layer, an active layer, a p-type cladding layer, and a p-type current diffusion layer are sequentially deposited. On the opposite surface of the GaAs substrate to the surface on which the n-type cladding layer is formed (that is, on the rear surface of the GaAs substrate), a rear side electrode is formed. A front surface electrode is formed on the p-type current diffusion layer.

The semiconductor light emitting devices as configured above can be utilized as vehicle rear tail lamps, various indicators, backlight sources for mobile devices such as a cellular phone, and the like. Further, as the demands for vehicle headlamps, backlight sources for liquid crystal display devices, general illuminators, and the like have increased, markets for such semiconductor light emitting devices have expanded. In view of this, further improvements in light emission efficiency and reliability of such semiconductor light emitting devices are also demanded.

In order to improve the light emission efficiency and simultaneously decrease the operating voltage, a technique is known in which a plurality of current diffusion layers having different carrier concentrations are stacked. Japanese Patent Application Laid-Open No. 2004-304090 discloses, for example, a technique of stacking three different current diffusion layers with different carrier concentrations. In the same patent document, a first current diffusion layer with the highest carrier concentration is formed on a cladding layer, and a second current diffusion layer with the lowest carrier concentration is formed on the first current diffusion layer. Then, a third current diffusion layer is formed as an uppermost layer. The third current diffusion layer has a carrier concentration lower than that of the first current diffusion layer and higher than that of the second current diffusion layer.

Another known technique is to reduce an operating voltage and power consumption by inserting an intermediate layer between a cladding layer and a current diffusion layer, to relax a lattice mismatch. For example, Japanese Patent Application Laid-Open No. Hei 9-260724 (corresponding to U.S. Pat. No. 5,777,349) discloses a technique in which an AlInAs layer is inserted as an intermediate layer between an AlGaInP cladding layer and a GaP layer.

Further, it is known that the carrier concentration in an active layer is important for improving the light emission efficiency. Japanese Patent Application Laid-Open No. Hei 11-68154 discloses, for example, that it is important in an AlGaInP type semiconductor light emitting device with a high light emission efficiency to control the Si and Zn concentrations in the active layer.

There have been further strong demands for a semiconductor light emitting device to provide a high luminance and have a higher reliability. Specifically, it is required to precisely control the carrier concentration of an active layer in order to obtain a high light emission efficiency and to reduce a forward voltage in order to obtain high reliability.

However, the carrier concentration in the active layer is apt to be adversely affected by impurities migrated (diffused) from the current diffusion layer on a cladding layer. Accordingly, it is difficult to precisely control the carrier concentration in the active layer because of the different amount of impurities diffused from the current diffusion layer device by device due to the variations in growing temperature, growing time, thickness, and the like, of the current diffusion layer.

Furthermore, a forward voltage is also adversely affected by the thickness variation of the semiconductor layer formed on the growing substrate, the diffused amount of impurities, and the like. Accordingly, it is difficult to sufficiently reduce the forward voltage due to the variations in the thickness of the semiconductor layer, the amount of impurities, and the like.

SUMMARY OF THE INVENTION

One object of the present invention is to provide a semiconductor light emitting device that provides a high light emission efficiency and has high reliability, as well as a method for manufacturing such a semiconductor light emitting device.

According to one aspect of the present invention, a semiconductor light emitting device includes: a first cladding layer of a first conduction type; a second cladding layer of a second conduction type; an active layer of the second conduction type provided between the first cladding layer and the second cladding layer; a diffusion control layer formed by sequentially stacking an intermediate layer of the second conduction type and a first transparent conductive layer of the second conduction type on the second cladding layer in this order, the intermediate layer being lattice matched with the first cladding layer; a second transparent conductive layer of the second conduction type, provided on the diffusion control layer and having an impurity in a concentration lower than an impurity concentration of the diffusion control layer; and a third transparent conductive layer of the second conduction type, provided on the second transparent conductive layer and having an impurity in a concentration higher than an impurity concentration of the second transparent conduction layer, wherein a boundary between the intermediate layer and the first transparent conductive layer is a lattice mismatch interface.

With this structure, a semiconductor light emitting device according to an aspect of the present invention can have a stacked structure including, on the second cladding layer, the intermediate layer, the first transparent conductive layer, the second transparent conductive layer, and the third transparent conductive layer in this order, wherein the second cladding layer sandwiches the active layer together with the first cladding layer and wherein the third transparent conductive layer has an impurity in a concentration higher than an impurity concentration of the second transparent conductive layer. The intermediate layer and the first transparent conductive layer constitute a diffusion control layer that controls the amount of impurities diffused from the second transparent conductive layer and the third transparent conductive layer. Furthermore, the diffusion control layer has the impurities in a concentration higher than the second transparent conductive layer and includes the lattice mismatch interface.

The provision of the diffusion control layer and second and third transparent conductive layers (being an impurity source) on the diffusion control layer can reduce the forward voltage and control the diffusion of impurities from the second and third transparent conductive layers. Accordingly, a semiconductor light emitting device with a high luminance and high reliability can be provided.

In addition, according to another aspect of the present invention, a method for manufacturing a semiconductor light emitting device includes: growing an n-type AlGaInP cladding layer, an undoped AlGaInP active layer, and a p-type AlGaInP cladding layer which is doped with Zn; sequentially depositing, on the p-type AlGaInP cladding layer, (i) a p-type AlGaInP intermediate layer which is doped with Zn and has a thickness of at least 20 nm and (ii) a first transparent conductive layer which is made of GaInP doped with Zn, in this order, to grow a diffusion control layer having a total thickness of at most 100 nm; growing a second transparent conductive layer which is made of GaInP on the diffusion control layer, the second transparent conductive layer being doped with Zn in a concentration lower than a concentration of Zn in the diffusion control layer; and growing a third transparent conductive layer which is made of GaInP on the second transparent conductive layer, the third transparent conductive layer being doped with Zn in a concentration higher than the concentration of Zn in the second transparent conductive layer.

With this control of the thickness of the diffusion control layer and the concentrations of Zn in the respective transparent conductive layers, the obtained semiconductor light emitting device can provide a high luminance and have high reliability.

BRIEF DESCRIPTION OF DRAWINGS

These and other characteristics, features, and advantages of the present invention will become clear from the following description with reference to the accompanying drawings, wherein:

FIG. 3 is a graph showing the Zn concentrations (distribution) in various layers of the semiconductor light emitting device of the first exemplary embodiment according to the present invention;

FIG. 4 is a graph showing the relationship between the average Zn concentration in the active layer and the normalized optical output (light emission efficiency);

FIG. 21 is a cross-sectional view illustrating a step of manufacturing the semiconductor light emitting device of the second exemplary embodiment according to the present invention;

DETAILED DESCRIPTION

Exemplary embodiments of semiconductor light emitting devices of the present invention are described below with reference to the accompanying drawings.

[First Exemplary Embodiment]

Figure 1:
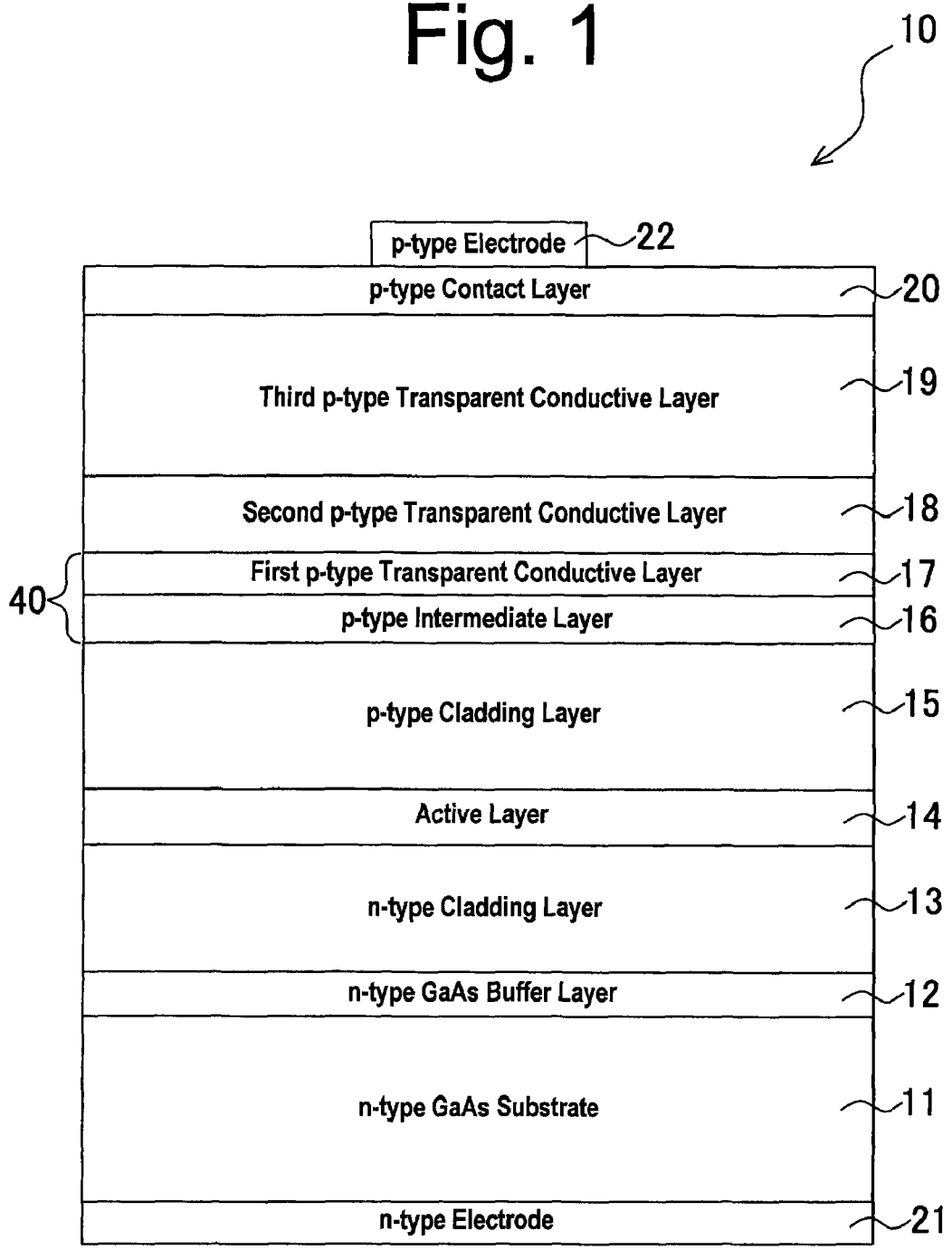
FIG. 1 is a cross-sectional view of a semiconductor light emitting device of a first exemplary embodiment according to the present invention.

With reference to FIGS. 1 and 2, a description will be given of the structure of the semiconductor light emitting device of the first exemplary embodiment according to the present invention and the manufacturing method thereof.

FIG. 1 is a cross-sectional view of a semiconductor light emitting device 10 of the first exemplary embodiment according to the present invention. As shown in FIG. 1, the semiconductor light emitting device 10 includes an n-type GaAs substrate 11 serving as a growth substrate. On the main surface of the GaAs substrate 11, an n-type GaAs buffer layer 12, an n-type cladding layer 13, an active layer 14, a p-type cladding layer 15, a p-type intermediate layer 16, a first p-type transparent conductive layer 17 serving as a current diffusion layer, a second p-type transparent conductive layer 18 serving as a current diffusion layer, a third p-type transparent conductive layer 19 serving as a current diffusion layer, and a p-type contact layer 20 are deposited in this order. The p-type intermediate layer 16 is provided to relax a lattice mismatch between the p-type cladding layer 15 and the first p-type transparent conductive layer 17. Furthermore, the semiconductor light emitting device 10 has an n-type electrode 21 and a p-type electrode 22. The n-type electrode 21 is formed over the entire surface of the n-type GaAs substrate opposite to the surface where the n-type buffer layer 12 is formed. The p-type electrode 22 is formed at the center area on the p-type contact layer 20.

Hereinafter, the method for manufacturing the semiconductor light emitting device 10 having the above structure will be described in detail with reference to FIG. 2.

Figure 2A:
FIGS. 2A, 2B, 2C, and 2D are cross-sectional views illustrating steps of manufacturing the semiconductor light emitting device of the first exemplary embodiment according to the present invention.

First, the n-type GaAs substrate 11 is prepared as a growth substrate (see FIG. 2A). In the present exemplary embodiment, the n-type GaAs substrate 11 is formed by doping silicon (Si) and has a main surface inclined by 4 degrees with respect to the plane direction (100). Namely, the n-type GaAs substrate 11 is a four-degrees-off growth substrate.

Next, the n-type GaAs buffer layer 12 is deposited on the n-type GaAs substrate 11 by a metal organic chemical vapor deposition (MOCVD) method. The growth conditions are, for example, that the growth temperature is approximately 750° C. and that the growth pressure is approximately 10 kPa. Trimethyl gallium (TMGa) can be used as a metal organic (MO) material (being a group III raw material). Arsine ($AsH_3$) can be used as a group V gas. It should be noted that the n-type GaAs buffer layer 12 can have a thickness of approximately 0.5 μm.

Figure 2B:
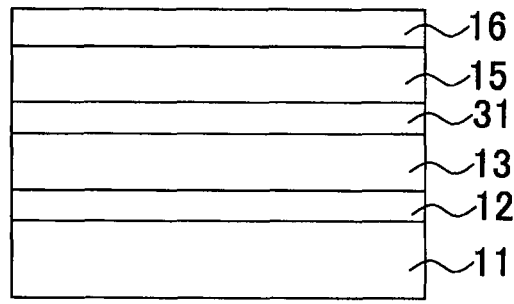

Furthermore, the n-type cladding layer 13, an undoped active layer 31, the p-type cladding layer 15, and the p-type intermediate layer 16 are deposited in this order over the n-type GaAs buffer layer 12 by the MOCVD method. FIG. 2B shows the state where the respective layers from the n-type cladding layer 13 to the p-type intermediate layer 16 are deposited. The growth conditions are, for example, that the growth temperature is approximately 750° C. and that the growth pressure is approximately 10 kPa. Examples of the MO material include TMGa, trimethyl aluminum (TMAl), trimethyl indium (TMI), and the like. Arsine ($AsH_3$) or phosphine ($PH_3$) can be used as a group V gas. It should be noted that the ratio of V/III can be 30 to 200. Examples of the material for doping impurities include silane ($SiH_4$) for an n-type impurity and dimethyl zinc (DMZn) for a p-type impurity. Hydrogen is used as a carrier gas. Specific processes for manufacturing these layers are as follows.

First, the n-type cladding layer 13 having a thickness of approximately 1 μm is formed on the n-type GaAs buffer layer 12 so that the n-type cladding layer 13 has a composition of $(Al_xGa_{1-x})_yIn_{1-y}P$ ($0 \leq x \leq 1$, $0 < y \leq 1$) and an Si concentration of approximately $5 \times 10^{17}$ atoms/cm³. In the present exemplary embodiment, the n-type cladding layer 13 is $(Al_{0.7}Ga_{0.3})_{0.5}In_{0.5}P$.

Next, the undoped active layer 31 having a thickness of approximately 830 nm is formed on the n-type cladding layer 13 so that the undoped active layer 31 has a composition of $(Al_xGa_{1-x})_yIn_{1-y}P$ ($0 \leq x \leq 1$, $0 < y \leq 1$) and has no impurities doped. Herein, the x and y can be set so that the bandgap of the undoped active layer 31 becomes smaller than the bandgaps of the n-type cladding layer 13 and the p-type cladding layer 15. In the present exemplary embodiment, the undoped active layer 31 can have well layers of $(Al_{0.15}Ga_{0.85})_{0.5}In_{0.5}P$ and barrier layers of $(Al_{0.5}Ga_{0.5})_{0.5}In_{0.5}P$ having a quantum well structure (30 cycles). Each well layer has a thickness of approximately 18 nm and each barrier layer has a thickness of approximately 10 nm.

Next, the p-type cladding layer 15 having a thickness of approximately 1 μm is formed on the undoped active layer 31 so that the p-type cladding layer 15 has a composition of $(Al_xGa_{1-x})_yIn_{1-y}P$ ($0 \leq x \leq 1$, $0 < y \leq 1$) and has Zn doped. During the manufacturing, the supply rate of DMZn should be controlled so that the average Zn concentration in the p-type cladding layer 15 is approximately $3 \times 10^{17}$ atoms/cm³. In the present exemplary embodiment, the p-type cladding layer 15 is $(Al_{0.7}Ga_{0.3})_{0.5}In_{0.5}P$.

Next, the p-type intermediate layer 16 having a thickness of approximately 20 nm is formed on the p-type cladding layer 15 so that the p-type intermediate layer 16 has a composition of $(Al_xGa_{1-x})_yIn_{1-y}P$ ($0 \leq x \leq 1$, $0 < y \leq 1$) and has Zn doped. During the manufacturing, the supply rate of DMZn should be controlled so that the average Zn concentration in the p-type intermediate layer 16 is approximately $1 \times 10^{18}$ atoms/cm³. In the present exemplary embodiment, the p-type intermediate layer 16 is $(Al_{0.5}Ga_{0.5})_{0.5}In_{0.5}P$. Herein, the p-type intermediate layer 16 is required to have an Al composition ratio of at least 0.3 in order to suppress the increase of forward voltage (Vf). By doing so, the p-type intermediate layer 16 can form a bandgap between the bandgaps of the p-type cladding layer 15 and the first transparent conductive layer 17, thereby decreasing the forward voltage of the semiconductor light emitting device 10.

Figure 2C:
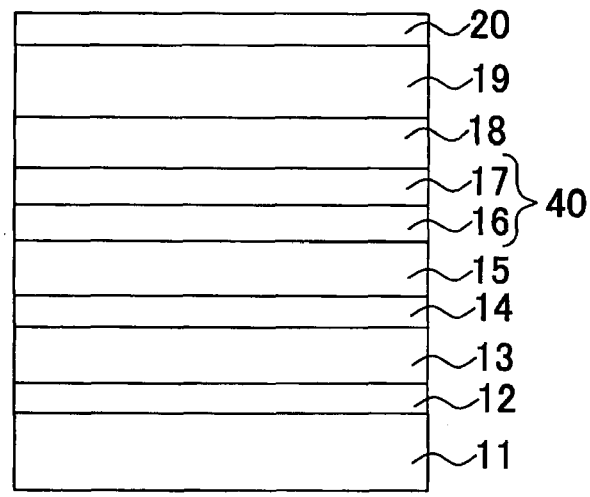

Next, the first p-type transparent conductive layer 17, the second p-type transparent conductive layer 18, the third p-type transparent conductive layer 19, and the p-type contact layer 20 are sequentially deposited in this order over the p-type intermediate layer 16 by the MOCVD method. FIG. 2C shows the state where the respective layers from the first p-type transparent conductive layer 17 to the p-type contact layer 20 are deposited. The growth conditions are, for example, that the growth temperature is approximately 850° C. and that the growth pressure is approximately 10 kPa. Examples of the MO material include TMGa, TMI, and the like. $PH_3$ can be used as a group V gas. It should be noted that the ratio of V/III can be 30 to 200. Examples of the material for doping impurities include DMZn. Hydrogen is used as a carrier gas. Specific processes for manufacturing these layers are as follows.

First, the first p-type transparent conductive layer 17 having a thickness of approximately 20 nm is formed on the p-type intermediate layer 16 so that the first p-type transparent conductive layer 17 has a composition of $Ga_xIn_{1-x}P$ ($0<x\leq1$) and has Zn doped. During the manufacturing, the supply rate of DMZn should be controlled so that the average Zn concentration in the first p-type transparent conductive layer 17 is approximately $1\times10^{18}$ atoms/cm$^3$. In the present exemplary embodiment, the first p-type transparent conductive layer 17 is $Ga_{0.95}In_{0.05}P$.

Next, the second p-type transparent conductive layer 18 having a thickness of approximately 200 nm is formed on the first p-type transparent conductive layer 17 so that the second p-type transparent conductive layer 18 has a composition of $Ga_xIn_{1-x}P$ ($0<x\leq1$) and has Zn doped. During the manufacturing, the supply rate of DMZn should be controlled so that the average Zn concentration in the second p-type transparent conductive layer 18 is approximately $8\times10^{17}$ atoms/cm$^3$. In the present exemplary embodiment, the second p-type transparent conductive layer 18 is $Ga_{0.95}In_{0.05}P$.

Subsequently, the third p-type transparent conductive layer 19 having a thickness of approximately 10 µm is formed on the second p-type transparent conductive layer 18 so that the third p-type transparent conductive layer 19 has a composition of $Ga_xIn_{1-x}P$ ($0<x\leq1$) and has Zn doped. During the manufacturing, the supply rate of DMZn should be controlled so that the average Zn concentration in the third p-type transparent conductive layer 19 is approximately $3\times10^{18}$ atoms/cm$^3$. In the present exemplary embodiment, the third p-type transparent conductive layer 19 is $Ga_{0.95}In_{0.05}P$.

Next, the p-type contact layer 20 having a thickness of approximately 200 nm is formed on the third p-type transparent conductive layer 19 so that the p-type contact layer 20 has a composition of $Ga_xIn_{1-x}P$ ($0<x\leq1$) and has Zn doped. During the manufacturing, the supply rate of DMZn should be controlled so that the average Zn concentration in the p-type contact layer 20 is approximately $1\times10^{19}$ atoms/cm$^3$. In the present exemplary embodiment, the p-type contact layer 20 is $Ga_{0.95}In_{0.05}P$.

Herein, the first to third p-type transparent conductive layers 17, 18, and 19 should have mirror surfaces to facilitate the control of Zn diffusion. In order to achieve this, the In content in these first to third p-type transparent conductive layers 17, 18, and 19 is preferably set to 1% or more. When the In content is less than 1% or zero, crystal defects will increase, thereby hindering the control of Zn diffusion. When the In content in these first to third p-type transparent conductive layers 17, 18, and 19 is more than 15%, the surface roughness will deteriorate. Accordingly, the In content in these layers should be controlled to be in the range of from 1% to 15%, and preferably in the range of from 3% to 10%.

During the formation of the first to third p-type transparent conductive layers 17, 18, and 19, Zn can diffuse from the first, second, and third p-type transparent conductive layers 17, 18, and 19 to the undoped active layer 31. The diffusing Zn may enter the undoped active layer 31. Thus, the undoped active layer 31 is doped with Zn to be altered to the active layer 14 containing Zn as a p-type carrier.

Figure 2D:
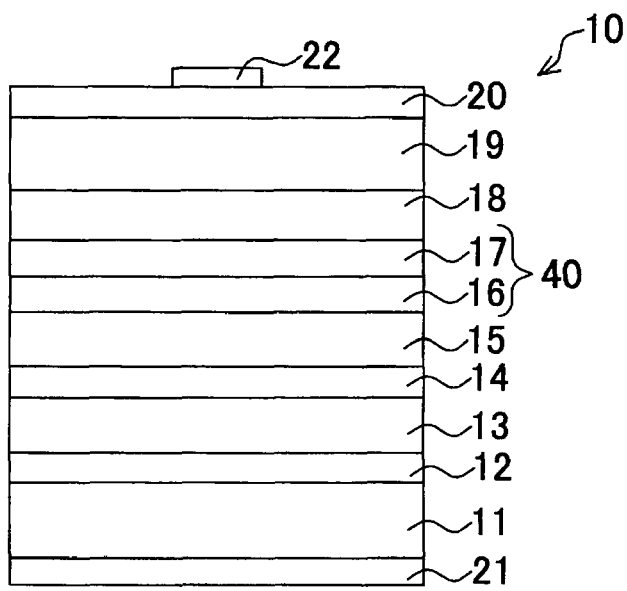

After forming the p-type contact layer 20, a resist is coated over the p-type contact layer 20. The coated resist is patterned to form a desired electrode pattern. The patterned resist has opening areas, through which an alloy of gold and zinc (AuZn) can be deposited by a vacuum deposition method. After depositing the alloy of gold and zinc, the resist is removed by a lift-off method so as to form the p-type electrode 22 with a desired shape. After that, an alloy of gold, germanium, and nickel (AuGeNi) is deposited over the rear surface of the n-type GaAs substrate 11 by a vacuum deposition method so as to form the n-type electrode 21. The n-type electrode 21 and the p-type electrode 22 are subjected to a heat treatment or an alloying treatment. When these processes are completed, the semiconductor light emitting device 10 can be finished as shown in FIG. 2D.

It should be noted that the method for manufacturing the semiconductor light emitting device 10 is not limited to the above processes, but may be constituted by various other processes. For example, the n-type parts may be replaced with corresponding p-type parts, and vice versa. The undoped active layer 31 can include well layers of $Ga_{0.5}In_{0.5}P$ and barrier layers of $(Al_{0.5}Ga_{0.5})_{0.5}In_{0.5}P$ or $Al_{0.5}In_{0.5}P$. Further undoped active layer 31 can be composed of a single layer made of $(Al_{0.15}Ga_{0.85})_{0.5}In_{0.5}P$. According to the same point of view, the n-type cladding layer 13 and the p-type cladding layer 15 can be made of $Al_{0.5}In_{0.5}P$. Alternatively, the n-type cladding layer 13 and the p-type cladding layer 15 can have a laminate structure of 2 or more layers. The p-type contact layer 20 can be composed of AlGaAs having an Al content of 60% or more.

A description will now be given of the diffused state of Zn in the semiconductor light emitting device 10. FIG. 3 is a graph showing the Zn concentrations (distribution) in various layers of the semiconductor light emitting device 10 manufactured in accordance with the first exemplary embodiment, as determined by secondary ion mass spectrometry (SIMS). It should be noted that all the doped Zn can function as a p-type carrier, and accordingly, the Zn concentration in each semiconductor layer is equal to the p-type carrier concentration.

As shown in FIG. 3, it was confirmed that the Zn concentration in the active layer 14 increases gradually with an increased distance from the n-type GaAs substrate 11. Note that the average Zn concentration of the active layer 14 was approximately $3\times10^{16}$ atoms/cm$^3$. The Zn concentration of the p-type cladding layer 15 was constant over the entire thickness thereof, and the average Zn concentration was approximately $3\times10^{17}$ atoms/cm$^3$. Accordingly, the measurement result revealed that the set value of the Zn profile during the growth of the p-type cladding layer 15 is almost matched to the average Zn concentration of the same after growth.

The Zn concentration of the p-type intermediate layer 16 rapidly increases with an increased distance from the n-type GaAs substrate 11. Furthermore, the Zn concentration of the first p-type transparent conductive layer 17 rapidly decreases with an increased distance from the n-type GaAs substrate 11. The measurement result revealed that a peak value of the Zn concentration in the region of the p-type intermediate layer 16 and the first p-type transparent conductive layer 17 exists near the boundary between them. The average Zn concentration in the region of the p-type intermediate layer 16 and the first p-type transparent conductive layer 17 was approximately $1\times10^{18}$ atoms/cm$^3$. Accordingly, the measurement result revealed that the set value of Zn profile during the growth of the p-type intermediate layer 16 and the first p-type transparent conductive layer 17 is almost matched to the average Zn concentration of the same after growth. It should be noted that the boundary between the p-type intermediate layer 16 and the first p-type transparent conductive layer 17 is a lattice mismatch interface because the distance of the crystal lattice (lattice constant) of the p-type intermediate layer 16 of the AlGaInP type is different from that of the first p-type transparent conductive layer 17 of the GaInP-type.

The Zn concentration of the second p-type transparent conductive layer 18 was constant over the entire thickness thereof, and the average Zn concentration was approximately $8 \times 10^{17}$ atoms/cm$^3$. The Zn concentration of the third p-type transparent conductive layer 19 was constant over the entire thickness thereof, and the average Zn concentration was approximately $3 \times 10^{18}$ atoms/cm$^3$. Accordingly, the measurement result revealed that the set values of Zn profile during the growth of the second and third p-type transparent conductive layers 18 and 19 are almost matched to the respective average Zn concentrations of the same after growth.

As shown in FIG. 3, the measurement result revealed that a peak value of the Zn concentration (spike-like concentration profile) exists between the p-type cladding layer 15 and the second p-type transparent conductive layer 18 due to the Zn concentration distribution of the p-type intermediate layer 16 and the first p-type transparent conductive layer 17.

The semiconductor light emitting device 10 has a structure in which the second p-type transparent conductive layer 18 having the average Zn concentration lower than the average Zn concentrations of the first and third p-type transparent conductive layers 17 and 19 is disposed between the first and third p-type transparent conductive layers 17 and 18. Accordingly, the structure can suppress the diffusion rate of Zn when fabricating the semiconductor layers (including the p-type cladding layer 15 to the p-type contact layer 20). This is because the Zn diffused from the third p-type transparent conductive layer 19 toward the undoped active layer 31 may be temporarily retained in the second p-type transparent conductive layer 18 due to the average Zn concentration of the second p-type transparent conductive layer 18 being lower than that of the third p-type transparent conductive layer 19.

Furthermore, in the semiconductor light emitting device 10, the p-type intermediate layer 16 and the first p-type transparent conductive layer 17 having the higher average Zn concentration than the average Zn concentrations of the p-type cladding layer 15 and the second p-type transparent conductive layer 18 are inserted between the p-type cladding layer 15 and the second p-type transparent conductive layer 18. The total thickness of the p-type intermediate layer 16 and the first p-type transparent conductive layer 17 is thinner than the thickness of any other semiconductor layer, meaning that a spike-like high concentration region exists. Accordingly, the structure can suppress the diffusion rate of Zn when fabricating the semiconductor layers (including the p-type cladding layer 15 to the p-type contact layer 20). This is because the portion consisting of the p-type intermediate layer 16 and the first p-type transparent conductive layer 17 may function as a barrier against the diffused Zn from the second and third p-type transparent conductive layers 18 and 19 toward the undoped active layer 31. In other words, the diffused Zn may be affected by Zn present in a high concentration in the portion consisting of the p-type intermediate layer 16 and the first p-type transparent conductive layer 17. This may hinder the diffusion of Zn near the boundary between the first p-type transparent conductive layer 17 and the second p-type transparent conductive layer 18. Accordingly, the semiconductor layer (spike-like high concentration region) consisting of the p-type intermediate layer 16 and the first p-type transparent conductive layer 17 may be referred to as a diffusion control layer 40 (see FIGS. 1 and 2). If the thickness of the diffusion control layer 40 exceeds 100 nm, the diffusion control layer 40 itself functions as a diffusion source. Namely, when the thickness of the diffusion control layer 40 exceeds 100 nm, it would be difficult to suppress the diffusion rate of Zn toward the undoped active layer 31 due to diffusion from the diffusion control layer 40. Accordingly, the thicknesses of the p-type intermediate layer 16 and the first p-type transparent conductive layer 17 should be determined so that the thickness of the diffusion control layer 40 is 100 nm or less. The thickness of the p-type intermediate layer 16 will be described in detail later.

Furthermore, the boundary between the p-type intermediate layer 16 and the first p-type transparent conductive layer 17 is a lattice mismatch interface, and accordingly, the structure can suppress the diffusion rate of Zn when fabricating the semiconductor layers (including the p-type cladding layer 15 to the p-type contact layer 20), as will be described further below.

The third p-type transparent conductive layer 19 has a greater thickness than the second p-type transparent conductive layer 18 as well as a higher average Zn concentration than the layer 18. Accordingly, the diffusion rate of Zn in the third p-type transparent conductive layer 19 is larger than that in the second p-type transparent conductive layer 18. As a result, diffusion of Zn from the third p-type transparent conductive layer 19 to the second p-type transparent conductive layer 18 is likely to occur. Furthermore, as the average Zn concentration in the third p-type transparent conductive layer 19 is higher than that in the second p-type transparent conductive layer 18, the Zn diffused from the third p-type transparent conductive layer 19 can be accumulated in the second p-type transparent conductive layer 18 (in other words, the diffused Zn can be trapped by the second p-type transparent conductive layer 18). This can lower the diffusion rate of Zn in the second p-type transparent conductive layer 18 more than in the third p-type transparent conductive layer 19. In addition, as the average Zn concentration in the second p-type transparent conductive layer 18 is lower than that in the first p-type transparent conductive layer 17, it is difficult for diffusion of Zn from the second p-type transparent conductive layer 18 to the first p-type transparent conductive layer 17 to occur. This can further lower the diffusion rate of Zn in the first p-type transparent conductive layer 17 more than in the second p-type transparent conductive layer 18. As a result, the diffusion of Zn in the first p-type transparent conductive layer 17, the second p-type transparent conductive layer 18, and the third p-type transparent conductive layer 19 may be suppressed more with the decreased distance to the active layer 14.

Each of the first, second, and third p-type transparent conductive layers 17, 18, and 19 has a number of dislocation lines (that is, a number of crystal defects exist). Zn can move through the crystal defects. In contrast, the p-type cladding layer 15 and the p-type intermediate layer 16 hardly contain crystal defects. Accordingly, when compared with the case in which Zn moves in the first, second, and third p-type transparent conductive layers 17, 18, and 19, Zn cannot easily move in the p-type cladding layer 15 and the p-type intermediate layer 16. This means that the diffusion rate of Zn in the first, second, and third p-type transparent conductive layers 17, 18, and 19 is higher than that in the p-type cladding layer 15 and the p-type intermediate layer 16. As a result, it is difficult for diffusion of Zn from the first p-type transparent conductive layer 17 to the p-type intermediate layer 16 to occur, and the diffusion rate of Zn in the p-type intermediate layer 16 is further lowered with respect to the diffusion rate of Zn in the first p-type transparent conductive layer 17. Note that the diffusion rate of Zn due to the difference in Zn concentration hardly changes in the p-type cladding layer 15 and the p-type intermediate layer 16 because they do not have any crystal defects, meaning that the diffusion rate of Zn is constant in both the layers.

As described above, the semiconductor light emitting device 10 includes the lattice mismatch interface within the diffusion control layer 40 where the spike-like high concentration region exists. This structure can effectively suppress the diffusion of Zn in the layers above the lattice mismatch interface (namely, including the first, second, and third p-type transparent conductive layers 17, 18, and 19). In addition, the diffusion of Zn can also be hindered by the lattice mismatch interface.

Suppose the case, for example, that the first p-type transparent conductive layer 17 is eliminated and the lattice mismatch interface is disposed outside the diffusion control layer 40. In this case, the diffusion of Zn in the upper layers above the lattice mismatch interface may be suppressed only by the second and third p-type transparent conductive layers 18 and 19. Accordingly, the diffusion rate of Zn at the lattice mismatch interface may be greater than that in the present exemplary embodiment. As a result, the diffusion of Zn in the layers above the lattice mismatch interface is not sufficiently suppressed.

Next, by referring to the experimental results, descriptions will be given of the high luminance and high reliability of the semiconductor light emitting device 10 of the present exemplary embodiment and the tolerance of each constituent part of the semiconductor light emitting device 10.

FIG. 4 shows the normalized optical outputs (light emission efficiency) of respective semiconductor light emitting devices 10 with varied average Zn concentrations in the active layer 14. The abscissa in FIG. 4 represents the average Zn concentration in the active layer 14 and the ordinate represents the normalized optical output (light emission efficiency). The light emission efficiency of the ordinate is shown by an arbitrary unit, and plotted with respect to a sample having an average Zn concentration of $3.1 \times 10^{16}$ atoms/cm$^3$ whose light emission efficiency is set to be equal to 1.0. The abscissa is scaled logarithmically.

As shown in FIG. 4, when the average Zn concentration in the active layer 14 is lowered to the region less than $2.0 \times 10^{16}$ atoms/cm$^3$, the light emission efficiency is rapidly reduced. When the average Zn concentration in the active layer 14 is increased to the region higher than $4.0 \times 10^{16}$ atoms/cm$^3$, the light emission efficiency is also rapidly reduced. Furthermore, the stable light emission efficiency is achieved in the region of $2.0 \times 10^{16}$ to $4.0 \times 10^{16}$ atoms/cm$^3$ and has its peak in this region. Accordingly, the average Zn concentration in the active layer 14 should be in the range of $2.0 \times 10^{16}$ to $4.0 \times 10^{16}$ atoms/cm$^3$ in order to reduce the variation in the light emission efficiency of the semiconductor light emitting device 10 as a whole and to provide a high light emission efficiency.

Nine (9) samples were produced by the above-described manufacturing method while the average Zn concentrations were changed and combined as follows:

the average Zn concentration in the first p-type transparent conductive layer 17: $6.0 \times 10^{17}$, $1.0 \times 10^{18}$, and $1.0 \times 10^{19}$ atoms/cm$^3$ (three types);

the average Zn concentration in the second p-type transparent conductive layer 18: $5.0 \times 10^{17}$, $8.0 \times 10^{17}$, and $1.0 \times 10^{18}$ atoms/cm$^3$ (three types); and the average Zn concentration in the third p-type transparent conductive layer 19: $1.0 \times 10^{18}$ atoms/cm$^3$ (fixed).

Figure 5:
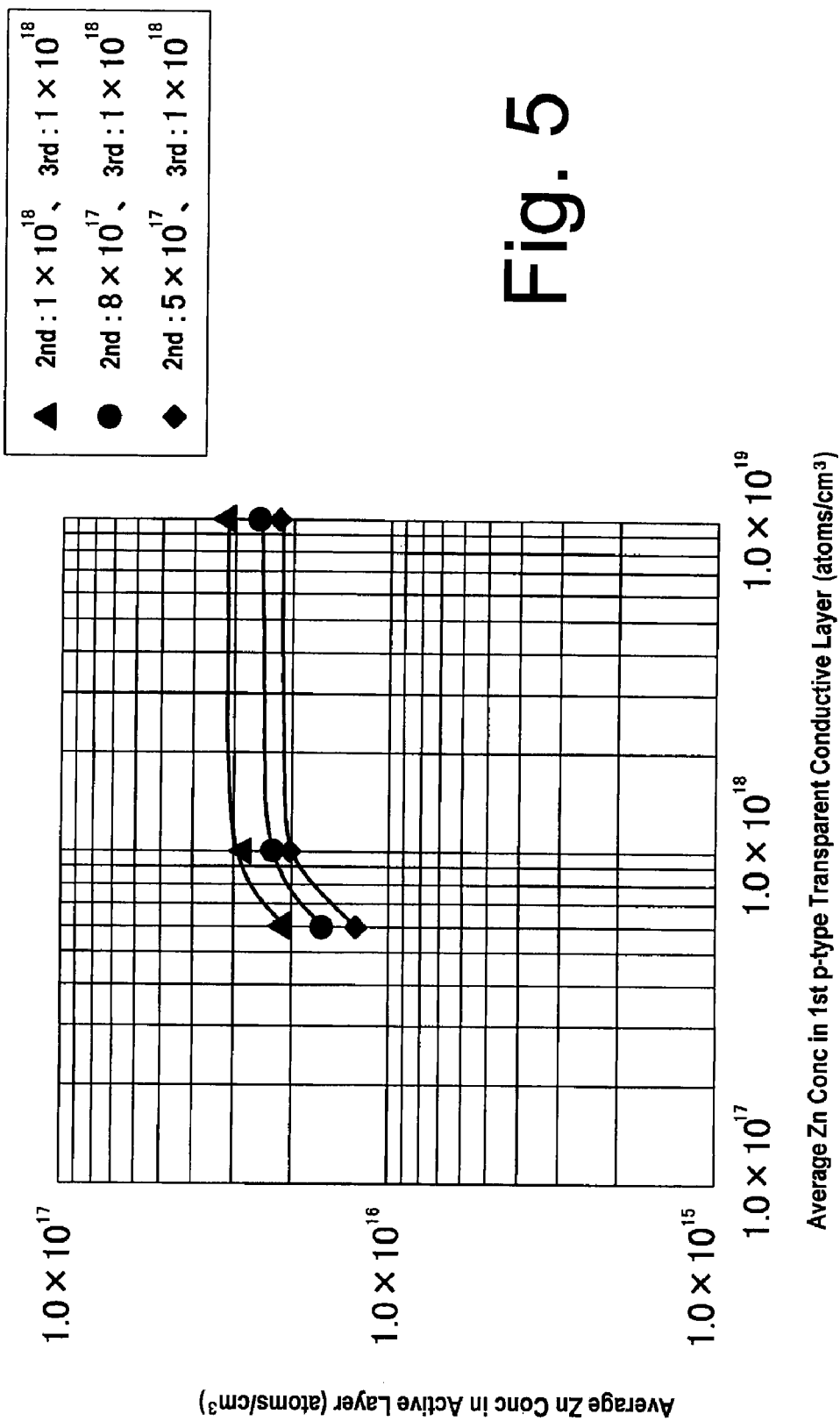
FIG. 5 is a graph showing the relationship between the average Zn concentration in the first p-type transparent conductive layer and the average Zn concentration in the active layer of the semiconductor light emitting device of the first exemplary embodiment according to the present invention.

The Zn concentration in the active layer 14 was determined by a SIMS analysis. The analysis results are shown in FIG. 5. It should be noted that the other parameters (including the thicknesses of the other semiconductor layers, the impurity concentrations thereof, and the like) were the same as the set values in the above-described manufacturing method. The abscissa in FIG. 5 represents the average Zn concentration in the first p-type transparent conductive layer 17 (atoms/cm$^3$), and the ordinate represents the average Zn concentration in the active layer 14 (atoms/cm$^3$). The abscissa and the ordinate are scaled logarithmically.

As shown in FIG. 5, the measurement results reveal that the average Zn concentration in the active layer 14 hardly changes when the average Zn concentration of the first p-type transparent conductive layer 17 is in the range of $1.0 \times 10^{18}$ to $1.0 \times 10^{19}$ atoms/cm$^3$. The measurement results also reveal that when the average Zn concentration in the second p-type transparent conductive layer 18 increases, the average Zn concentration in the active layer 14 also increases. Furthermore, when the average Zn concentration in the first p-type transparent conductive layer 17 is in the range of $1.0 \times 10^{18}$ to $1.0 \times 10^{19}$ atoms/cm$^3$, the average Zn concentration in the active layer 14 can take an optimal range of $2.0 \times 10^{16}$ to $4.0 \times 10^{16}$ atoms/cm$^3$.

Next, nine (9) samples were produced by the above-described manufacturing method while the average Zn concentrations were changed and combined as follows:

the average Zn concentration in the first p-type transparent conductive layer 17: $6.0 \times 10^{17}$, $1.0 \times 10^{18}$, and $1.0 \times 10^{19}$ atoms/cm$^3$ (three types);

the average Zn concentration in the second p-type transparent conductive layer 18: $5.0 \times 10^{17}$, $8.0 \times 10^{17}$, and $1.0 \times 10^{18}$ atoms/cm$^3$ (three types); and the average Zn concentration in the third p-type transparent conductive layer 19: $3.0 \times 10^{18}$ atoms/cm$^3$ (fixed).

Figure 6:
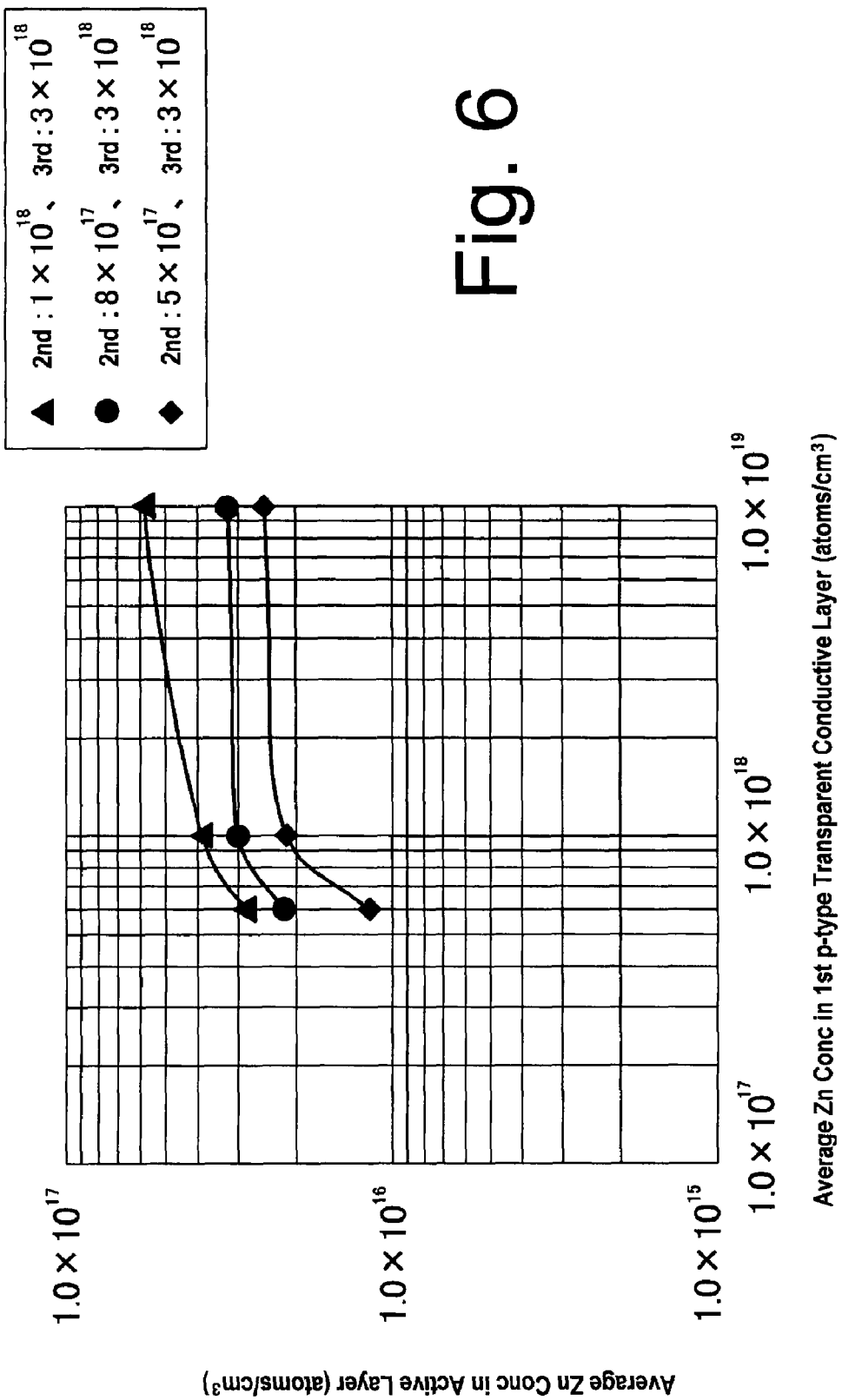
FIG. 6 is a graph showing the relationship between the average Zn concentration in the first p-type transparent conductive layer and the average Zn concentration in the active layer of the semiconductor light emitting device of the first exemplary embodiment according to the present invention.

The Zn concentration in the active layer 14 was determined by a SIMS analysis. The analysis results are shown in FIG. 6. It should be noted that the other parameters (including the thicknesses of the other semiconductor layers, the impurity concentrations thereof, and the like) were the same as the set values in the above-described manufacturing method. The abscissa in FIG. 6 represents the average Zn concentration in the first p-type transparent conductive layer 17 (atoms/cm$^3$), and the ordinate represents the average Zn concentration in the active layer 14 (atoms/cm$^3$). The abscissa and the ordinate are scaled logarithmically.

As shown in FIG. 6, the measurement results reveal that the average Zn concentration in the active layer 14 hardly changes when the average Zn concentration of the first p-type transparent conductive layer 17 is in the range of $1.0 \times 10^{18}$ to $1.0 \times 10^{19}$ atoms/cm$^3$, while the average Zn concentration of the second p-type transparent conductive layer 18 is $5.0 \times 10^{17}$ or $8.0 \times 10^{17}$ atoms/cm$^3$. The measurement results also reveal that when the average Zn concentration in the first p-type transparent conductive layer 17 increases in the range of $1.0 \times 10^{18}$ to $1.0 \times 10^{19}$ atoms/cm$^3$ while the average Zn concentration of the second p-type transparent conductive layer 18 is $1.0 \times 10^{18}$ atoms/cm$^3$, the average Zn concentration in the active layer 14 increases. As in the analysis results shown in FIG. 5, the measurement results shown in FIG. 6 also reveal that when the average Zn concentration in the second p-type transparent conductive layer 18 increases, the average Zn concentration in the active layer 14 also increases. Furthermore, when the average Zn concentration in the first p-type transparent conductive layer 17 is in the range of $1.0 \times 10^{18}$ to $1.0 \times 10^{19}$ atoms/cm$^3$ while the average Zn concentration of the second p-type transparent conductive layer 18 is $5.0 \times 10^{17}$ or $8.0 \times 10^{17}$ atoms/cm$^3$, the average Zn concentration in the active layer 14 can take an optimal range of $2.0 \times 10^{16}$ to $4.0 \times 10^{16}$ atoms/cm$^3$. However, when the average Zn concentration in the first p-type transparent conductive layer 17 is higher than $1.0 \times 10^{18}$ atoms/cm$^3$, the average Zn concentration in the second p-type transparent conductive layer 18 is $1.0 \times 10^{18}$ atoms/cm$^3$, and the average Zn concentration in the third p-type transparent conductive layer 19 is $3.0\times10^{18}$ atoms/cm$^3$, the average Zn concentration in the active layer 14 is outside of the optimal range of $2.0\times10^{16}$ to $4.0\times10^{16}$ atoms/cm$^3$. Accordingly, the average Zn concentration in the first p-type transparent conductive layer 17 should be set to $1.0\times10^{19}$ atoms/cm$^3$, and when the average Zn concentration in the third p-type transparent conductive layer 19 is $3.0\times10^{18}$ atoms/cm$^3$, the average Zn concentration in the second p-type transparent conductive layer 18 should be set to at most $8.0\times10^{17}$ atoms/cm$^3$.

Next, nine (9) samples were produced by the above-described manufacturing method while the average Zn concentrations were changed and combined as follows:

the average Zn concentration in the first p-type transparent conductive layer 17: $1.0\times10^{18}$ atoms/cm$^3$ (fixed);

the average Zn concentration in the second p-type transparent conductive layer 18: $5.0\times10^{17}$, $8.0\times10^{17}$, and $1.0\times10^{18}$ atoms/cm$^3$ (three types); and the average Zn concentration in the third p-type transparent conductive layer 19: $5.0\times10^{17}$, $1.0\times10^{18}$, and $3.0\times10^{18}$ atoms/cm$^3$ (three types).

Figure 7:
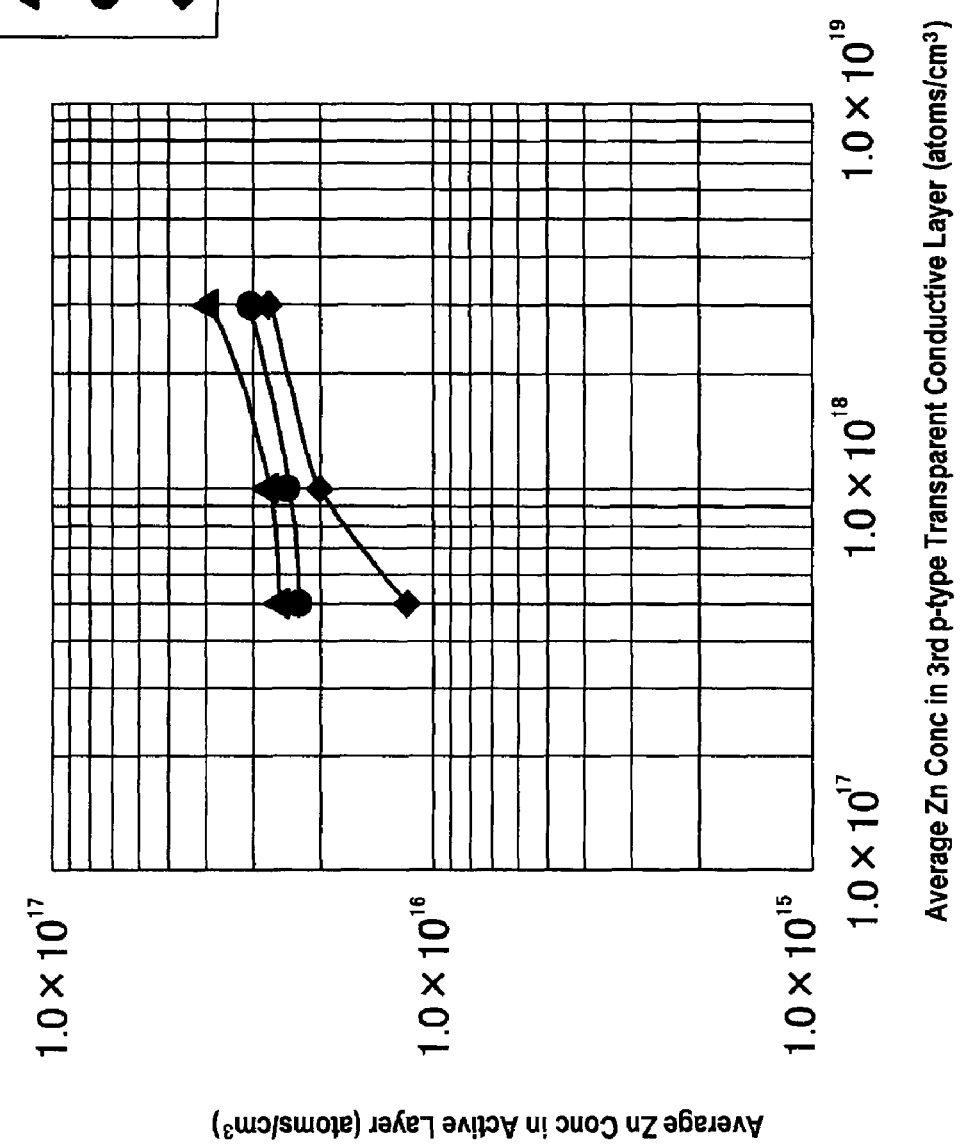
FIG. 7 is a graph showing the relationship between the average Zn concentration in the third p-type transparent conductive layer and the average Zn concentration in the active layer of the semiconductor light emitting device of the first exemplary embodiment according to the present invention.

The Zn concentration in the active layer 14 was determined by a SIMS analysis. The analysis results are shown in FIG. 7. It should be noted that the other parameters (including the thicknesses of the other semiconductor layers, the impurity concentrations thereof, and the like) were the same as the set values in the above-described manufacturing method. The abscissa in FIG. 7 represents the average Zn concentration in the third p-type transparent conductive layer 19 (atoms/cm$^3$), and the ordinate represents the average Zn concentration in the active layer 14 (atoms/cm$^3$). The abscissa and the ordinate are scaled logarithmically.

As shown in FIG. 7, the measurement results reveal that when the average Zn concentration in the third p-type transparent conductive layer 19 increases, the average Zn concentration in the active layer 14 does not rapidly increase. The measurement results also reveal that when the average Zn concentration in the second p-type transparent conductive layer 18 increases, the average Zn concentration in the active layer 14 also increases. Furthermore, when the average Zn concentration in the third p-type transparent conductive layer 19 is in the range of $1.0\times10^{18}$ to $3.0\times10^{18}$ atoms/cm$^3$, the average Zn concentration in the active layer 14 can take an optimal range of $2.0\times10^{16}$ to $4.0\times10^{16}$ atoms/cm$^3$.

Accordingly, the average Zn concentration in the first p-type transparent conductive layer 17 should be set to $1.0\times10^{18}$ to $1.0\times10^{19}$ atoms/cm$^3$, the average Zn concentration in the second p-type transparent conductive layer 18 should be set to $5.0\times10^{17}$ to $1.0\times10^{18}$ atoms/cm$^3$, and the average Zn concentration in the third p-type transparent conductive layer 19 should be set to $1.0\times10^{18}$ to $3.0\times10^{18}$ atoms/cm$^3$ in order to make the average Zn concentration in the active layer 14 be in the range of $2.0\times10^{16}$ to $4.0\times10^{16}$ atoms/cm$^3$. However, when the average Zn concentration in the first p-type transparent conductive layer 17 is $1.0\times10^{19}$ atoms/cm$^3$ and the average Zn concentration in the third p-type transparent conductive layer 19 is $3.0\times10^{18}$ atoms/cm$^3$, the average Zn concentration in the second p-type transparent conductive layer 18 should be set to $8.0\times10^{17}$ atoms/cm$^3$ or less. When the above conditions are satisfied, the average Zn concentration in the active layer 14 can be controlled to be within the optimal range ($2.0\times10^{16}$ to $4.0\times10^{16}$ atoms/cm$^3$)

Figure 8:
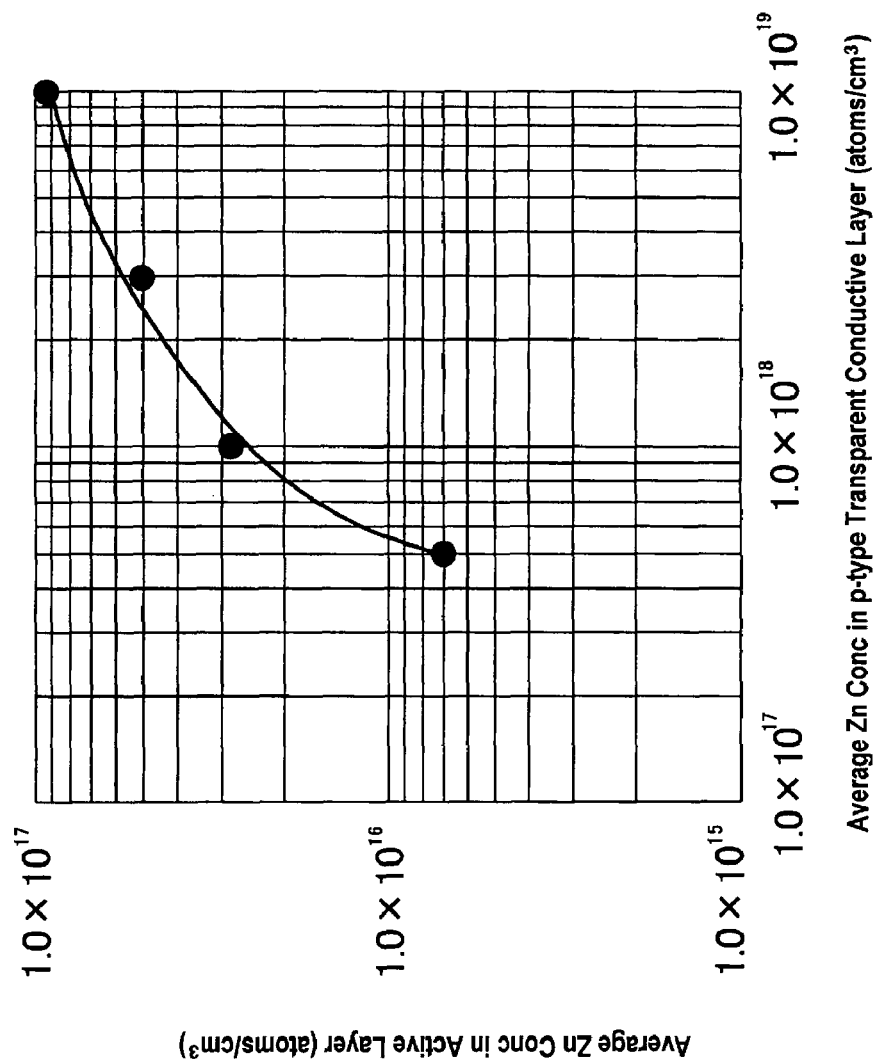
FIG. 8 is a graph showing the relationship between the average Zn concentration in the p-type transparent conductive layer and the average Zn concentration in the active layer of a conventional semiconductor light emitting device.

FIG. 8 shows the Zn concentration in the active layer 14 determined by a SIMS analysis for a semiconductor light emitting device having a conventional structure. Herein, "conventional structure" refers to a structure having a single p-type transparent conductive layer, not the p-type transparent conductive layers with a three layer structure as in the present exemplary embodiment. The other structural features are the same as those of the present exemplary embodiment. The abscissa in FIG. 8 represents the average Zn concentration in the p-type transparent conductive layer (atoms/cm$^3$), and the ordinate represents the average Zn concentration in the active layer (atoms/cm$^3$). The abscissa and the ordinate are scaled logarithmically.

As shown in FIG. 8, it is revealed that when the average Zn concentration in the p-type transparent conductive layer increases, the average Zn concentration in the active layer also increases. Furthermore, it is also revealed that in order to control the average Zn concentration in the active layer to be within the range of $2.0\times10^{16}$ to $4.0\times10^{16}$ atoms/cm$^3$, the average Zn concentration in the p-type transparent conductive layer should be controlled to be within a significantly narrow range of $1.0\times10^{18}$ to $2.0\times10^{18}$ atoms/cm$^3$. The comparison of FIG. 8 with FIGS. 5 to 7 reveals that the average Zn concentration in the active layer 14 hardly changes due to the p-type transparent conductive layers with the three layer structure as in the present exemplary embodiment even when the average Zn concentration in the respective p-type transparent conductive layers are varied. Accordingly, it is revealed that the use of the structure in the present exemplary embodiment can control the average Zn concentration in the active layer 14 with ease. In other words, the light emission efficiency of the semiconductor light emitting device 10 can be reduced in variation and the reproducibility thereof can be improved.

Next, six (6) samples were produced by the above-described manufacturing method while the average Zn concentrations and thicknesses of layers were changed and combined as follows:

the average Zn concentration in the first p-type transparent conductive layer 17: $1.0\times10^{18}$ atoms/cm$^3$ (fixed);

the average Zn concentration in the second p-type transparent conductive layer 18: $8.0\times10^{17}$ atoms/cm$^3$ (fixed);

the average Zn concentration in the third p-type transparent conductive layer 19: $1.0\times10^{18}$, and $3.0\times10^{18}$ atoms/cm$^3$ (two types); and the thickness of the second p-type transparent conductive layer 18: 0, 200 nm, and 1000 nm (three types).

Figure 9:
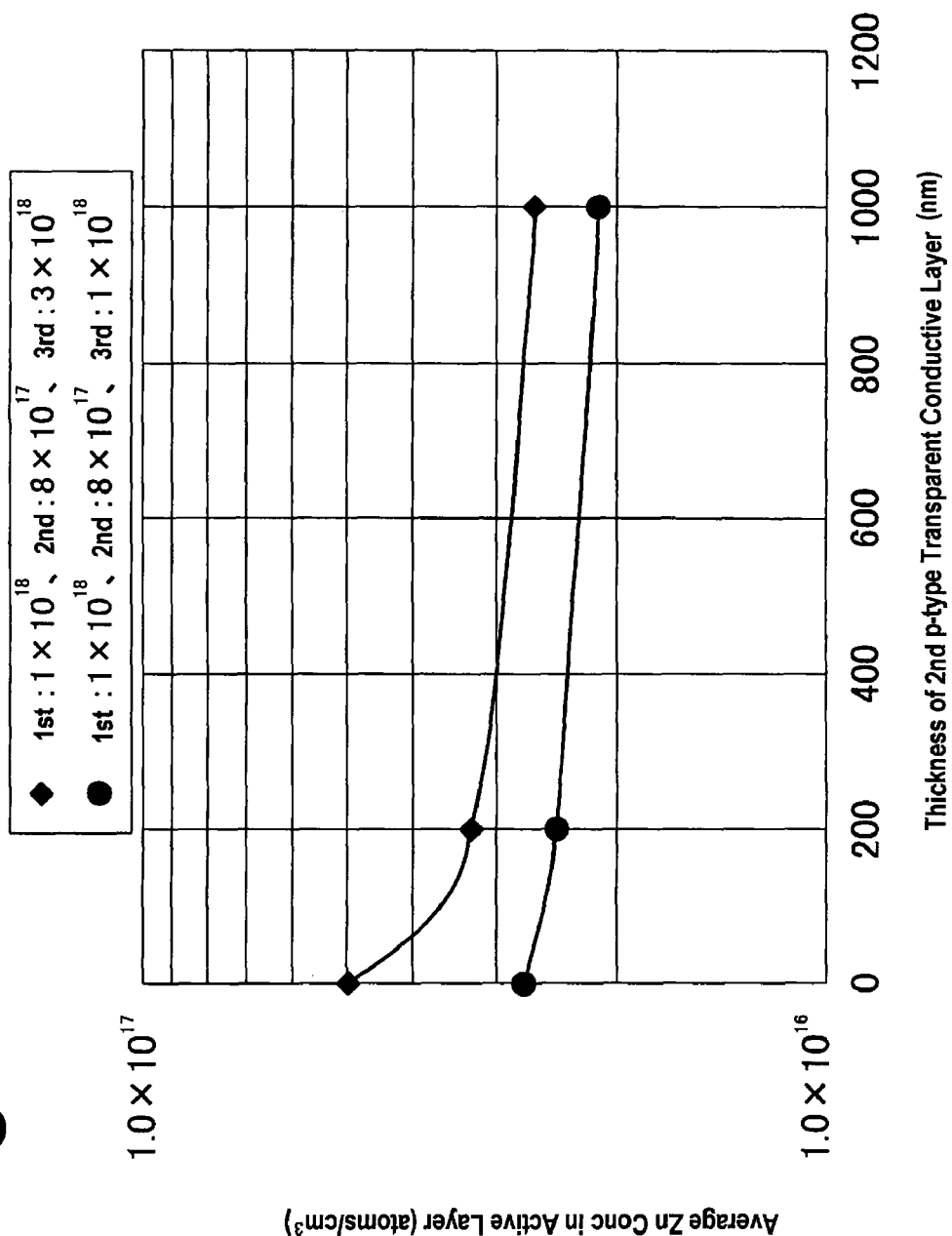
FIG. 9 is a graph showing the relationship between the thickness of the second p-type transparent conductive layer and the average Zn concentration in the active layer of the semiconductor light emitting device of the first exemplary embodiment according to the present invention.

The Zn concentration in the active layer 14 was determined by a SIMS analysis. The analysis results are shown in FIG. 9. It should be noted that the other parameters (including the thicknesses of the other semiconductor layers, the impurity concentrations thereof, and the like) were the same as the set values in the above-described manufacturing method. The abscissa in FIG. 9 represents the thickness of the second p-type transparent conductive layer 18 (nm), and the ordinate represents the average Zn concentration in the active layer 14 (atoms/cm$^3$). The ordinate is scaled logarithmically.

As shown in FIG. 9, the measurement results reveal that when the thickness of the second p-type transparent conductive layer 18 is at least 200 nm, the average Zn concentration in the active layer 14 hardly changes. The measurement results also reveal that when the average Zn concentration in the third p-type transparent conductive layer 19 increases, the average Zn concentration in the active layer 14 also increases. Furthermore, when the thickness of the second p-type transparent conductive layer 18 is at least approximately 80 nm, the average Zn concentration in the active layer 14 can take an optimal range of $2.0\times10^{16}$ to $4.0\times10^{16}$ atoms/cm$^3$. The analysis results reveal that when the thickness of the second p-type transparent conductive layer 18 is set to at least 200 nm, the average Zn concentration in the active layer 14 can be easily controlled to be within the optimal range. It should be noted that in view of the productivity of the semiconductor light emitting device 10, the thickness of the second p-type transparent conductive layer 18 is preferably at most 1000 nm.

Next, fourteen (14) samples were produced by the above-described manufacturing method while the average Zn concentrations and thicknesses of the layers were changed and combined as follows:

the average Zn concentration in the first p-type transparent conductive layer 17: $1.0 \times 10^{18}$ atoms/cm$^3$ (fixed);

the average Zn concentration in the second p-type transparent conductive layer 18: $8.0 \times 10^{17}$ atoms/cm$^3$ (fixed);

the average Zn concentration in the third p-type transparent conductive layer 19: $1.0 \times 10^{18}$, and $3.0 \times 10^{18}$ atoms/cm$^3$ (two types); and the thickness of the third p-type transparent conductive layer 18: 0, 500, 1500, 3000, 4000, 6000 and 10000 nm (seven types).

Figure 10:
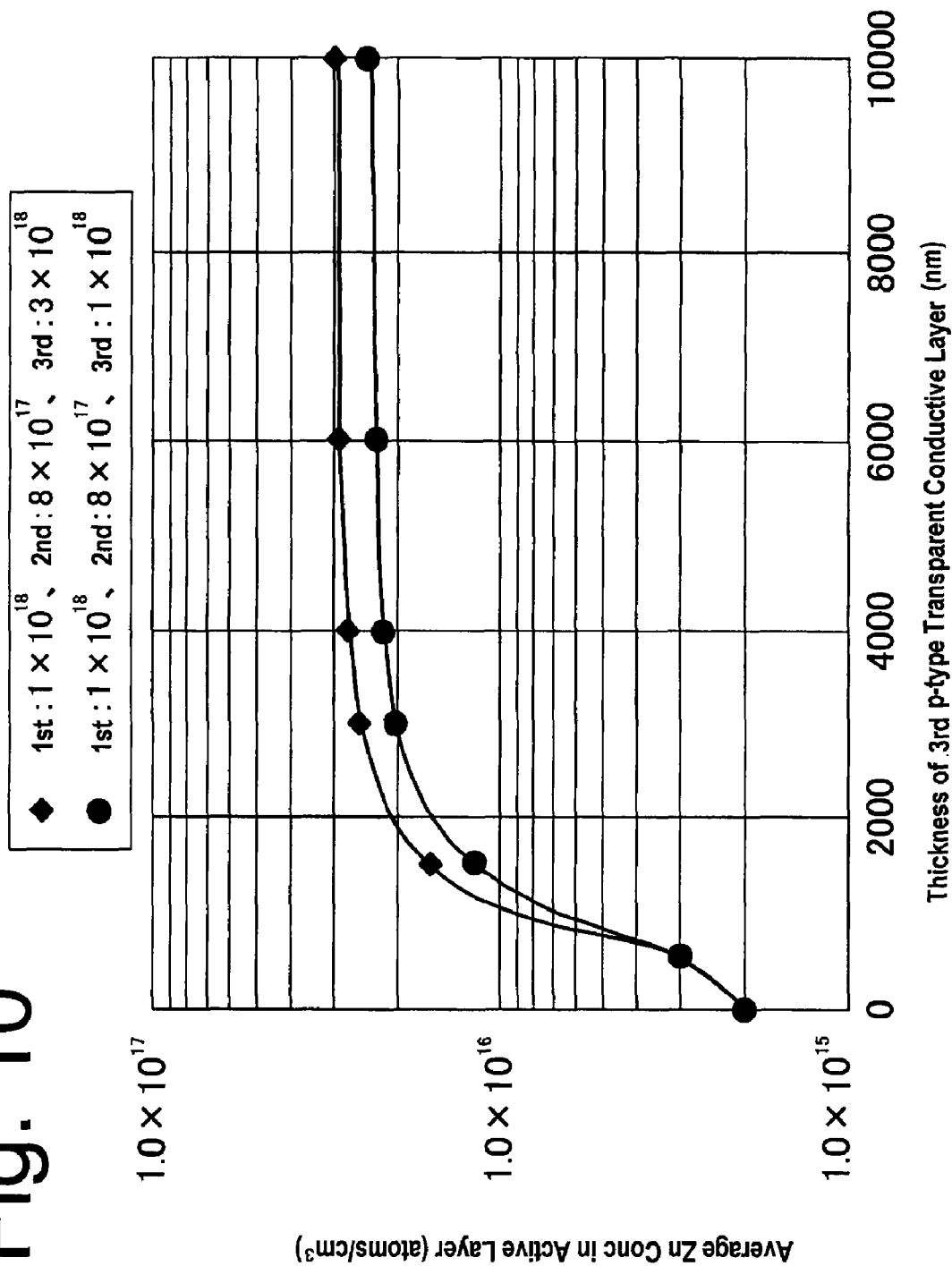
FIG. 10 is a graph showing the relationship between the thickness of the third p-type transparent conductive layer and the average Zn concentration in the active layer of the semiconductor light emitting device of the first exemplary embodiment according to the present invention.

The Zn concentration in the active layer 14 was determined by a SIMS analysis. The analysis results are shown in FIG. 10. It should be noted that the other parameters (including the thicknesses of the other semiconductor layers, the impurity concentrations thereof, and the like) were the same as the set values in the above-described manufacturing method. The abscissa in FIG. 10 represents the thickness of the third p-type transparent conductive layer 19 (nm), and the ordinate represents the average Zn concentration in the active layer 14 (atoms/cm$^3$). The ordinate is scaled logarithmically.

As shown in FIG. 10, the measurement results reveal that when the thickness of the third p-type transparent conductive layer 19 is at least 1500 nm, the average Zn concentration in the active layer 14 hardly changes. The measurement results also reveal that when the average Zn concentration in the third p-type transparent conductive layer 19 increases, the average Zn concentration in the active layer 14 also increases. Furthermore, when the thickness of the third p-type transparent conductive layer 19 is at least approximately 3000 nm, the average Zn concentration in the active layer 14 can take an optimal range of $2.0 \times 10^{16}$ to $4.0 \times 10^{16}$ atoms/cm$^3$. The analysis results reveal that when the thickness of the third p-type transparent conductive layer 19 is set to at least 3000 nm (3 μm), the average Zn concentration in the active layer 14 can be easily controlled to be within the optimal range. It should be noted that in view of the growth time and crystallinity of the third p-type transparent conductive layer 19, the thickness of the third p-type transparent conductive layer 19 is preferably at most 10000 nm (10 μm).

Figure 11:
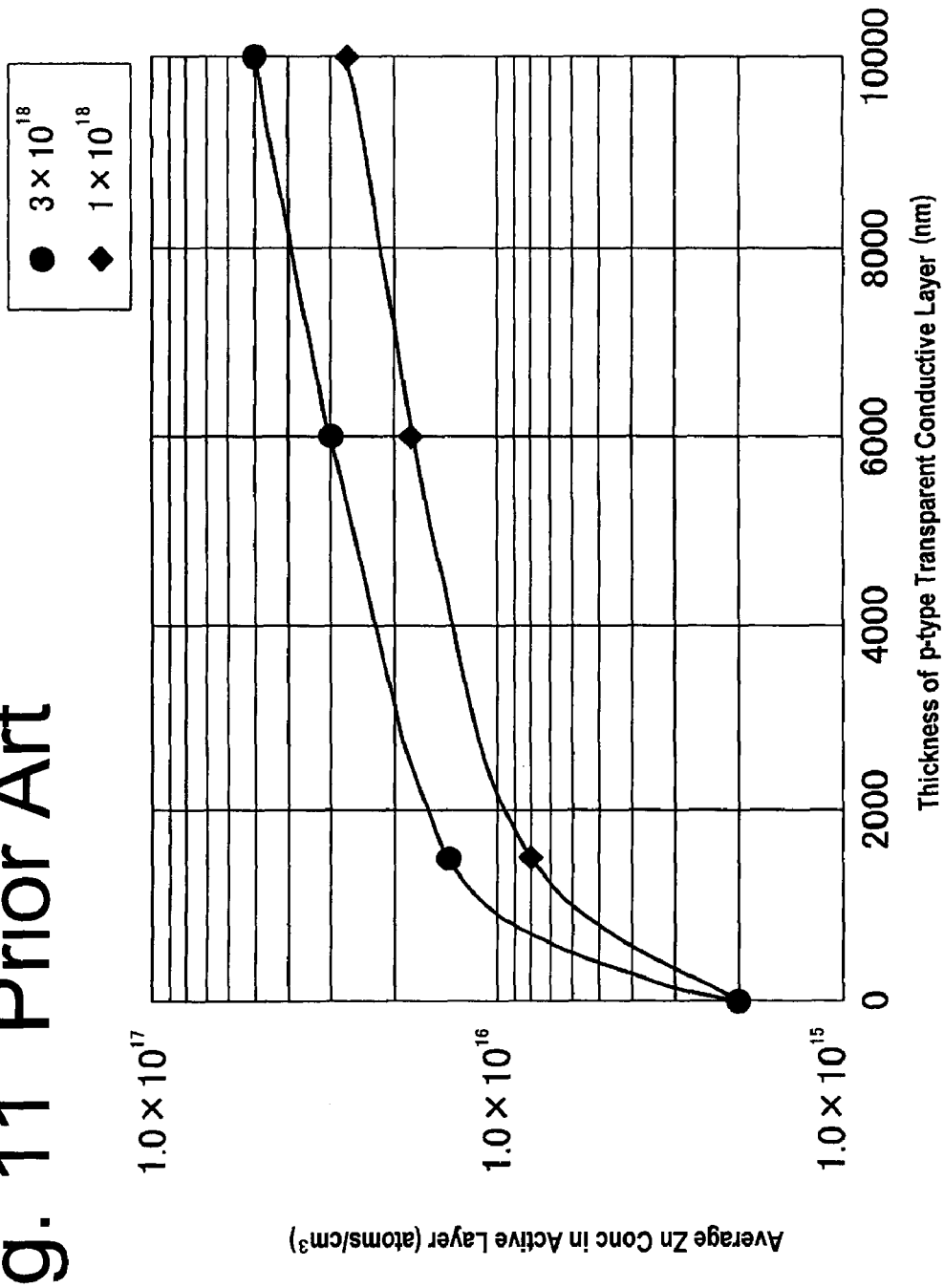
FIG. 11 is a graph showing the relationship between the thickness of the p-type transparent conductive layer and the average Zn concentration in the active layer of a conventional semiconductor light emitting device.

FIG. 11 shows the Zn concentration in the active layer determined by a SIMS analysis for eight (8) samples of the semiconductor light emitting device having the above-described conventional structure, in which two types of the average Zn concentration in the p-type transparent conductive layer ($1.0 \times 10^{18}$ and $3.0 \times 10^{18}$ atoms/cm$^3$) and four types of the thickness of the p-type transparent conductive layer (0, 1500, 6000 and 10000 nm) were combined with each other. The abscissa in FIG. 11 represents the thickness of the p-type transparent conductive layer (nm), and the ordinate represents the average Zn concentration in the active layer (atoms/cm$^3$). The abscissa and the ordinate are scaled logarithmically.

As shown in FIG. 11, it is revealed that when the thickness of the p-type transparent conductive layer increases, the average Zn concentration in the active layer also increases. Namely, the average Zn concentration in the active layer may depend on the thickness of the p-type transparent conductive layer. As the thickness of the p-type transparent conductive layer can be controlled by the growth temperature and the growth time, the average Zn concentration in the active layer may depend on the growth temperature and the growth time of the p-type transparent conductive layer. Furthermore, it is also revealed that in order to control the average Zn concentration in the active layer to be within the range of $2.0 \times 10^{16}$ to $4.0 \times 10^{16}$ atoms/cm$^3$, the thickness of the p-type transparent conductive layer should be controlled to be at least 7000 nm when the average Zn concentration of the p-type transparent conductive layer is $1.0 \times 10^{18}$ atoms/cm$^3$ or 3000 to 8000 nm when the average Zn concentration of the p-type transparent conductive layer is $3.0 \times 10^{18}$ atoms/cm$^3$.

A comparison of FIGS. 9 to 11 reveals that the average Zn concentration in the active layer 14 hardly changes due to the p-type transparent conductive layers of the three layer structure as in the present exemplary embodiment even when the thicknesses of the second and third p-type transparent conductive layers 18 and 19 are varied. Accordingly, it is revealed that the use of the structure in the present exemplary embodiment can control the average Zn concentration in the active layer 14 with ease regardless of the growth time and the growth temperature of the second and third p-type transparent conductive layers 18 and 19. In other words, the light emission efficiency of the semiconductor light emitting device 10 can be reduced in variation and the reproducibility thereof can be improved.

Figure 12:
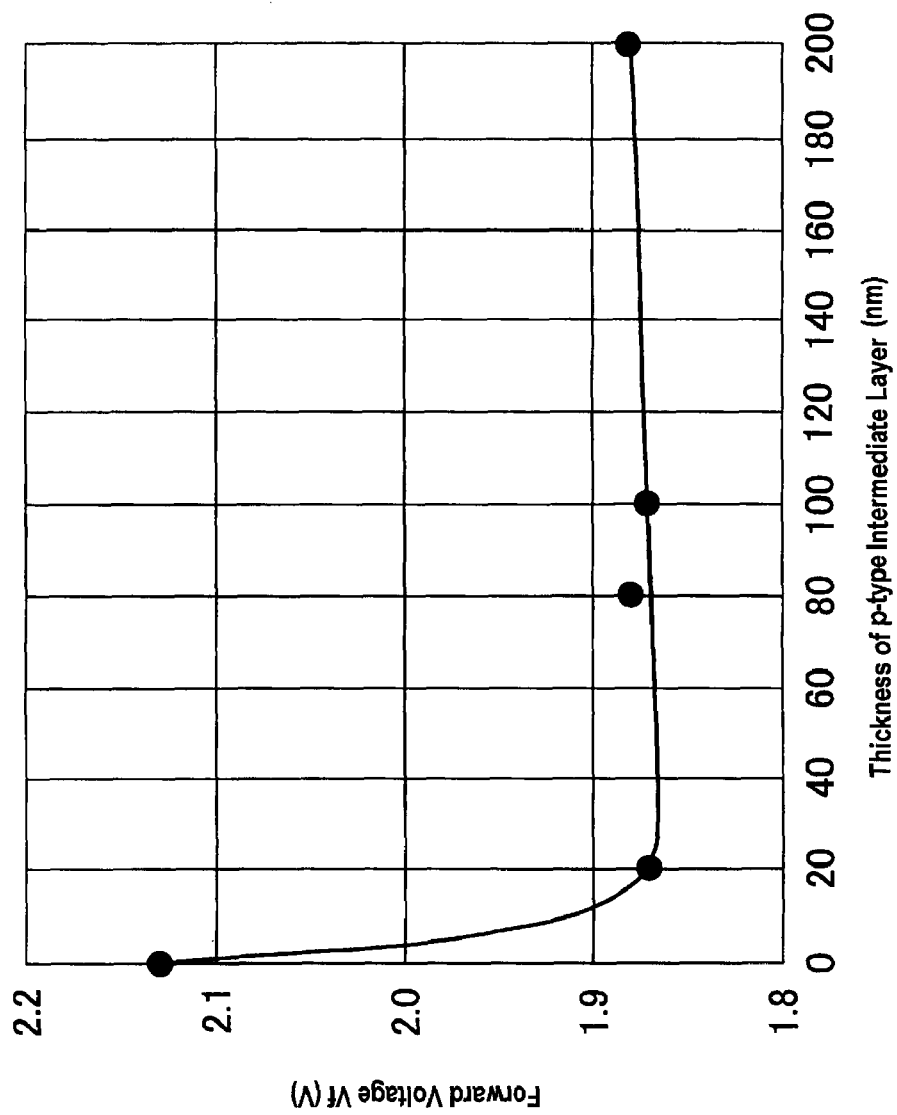
FIG. 12 is a graph showing the relationship between the thickness of the p-type intermediate layer and the forward voltage in the semiconductor light emitting device of the first exemplary embodiment according to the present invention.

Next, five (5) samples were produced by the above-described manufacturing method in which the thickness of the p-type intermediate layer 16 was set to 0, 20, 80, 100 and 200 nm. The forward voltage (Vf) of each of the obtained samples was determined. The measurement results are shown in FIG. 12. It should be noted that the other parameters (including the thicknesses of the other semiconductor layers, the impurity concentrations thereof, and the like) were the same as the set values in the above-described manufacturing method. The abscissa in FIG. 12 represents the thickness of the p-type intermediate layer 16 (nm), and the ordinate represents the forward voltage of the sample (V).

As shown in FIG. 12, the measurement results reveal that when the thickness of the p-type intermediate layer 16 is at least 20 nm, the forward voltage is almost constant. The measurement results also reveal that when the thickness of the p-type intermediate layer 16 is less than 20 nm, the forward voltage rapidly increases. Accordingly, if the p-type intermediate layer 16 is configured to have a thickness of at least 20 nm, the forward voltage of the semiconductor light emitting device 10 can be effectively reduced. In addition, in order to prevent the diffusion control layer 40 from becoming a diffusion source (that is, in order to configure the thickness of the diffusion control layer 40 to be at most 100 nm), the thickness of the p-type intermediate layer 16 should be less than 100 nm. For example, one exemplary device can have a p-type intermediate layer 16 with a thickness of 99 nm and a first p-type transparent conductive layer 17 with a thickness of 1 nm. Moreover, as the thickness of the p-type intermediate layer 16 should be configured to be at least 20 nm and the diffusion control layer 40 should be configured to be at most 100 nm, the thickness of the first p-type transparent conductive layer 17 should be at most 80 nm.

Figure 13:
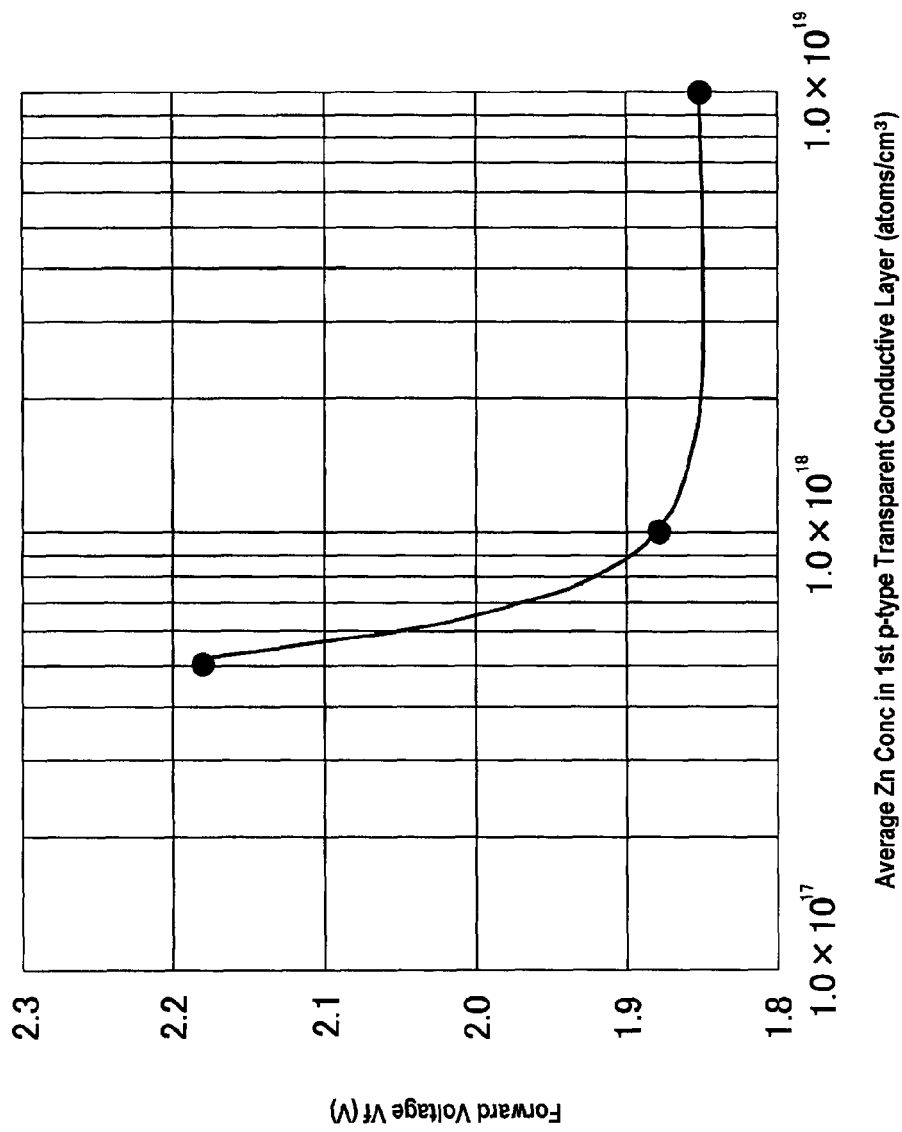
FIG. 13 is a graph showing the relationship between the average Zn concentration of the first p-type transparent conductive layer and the forward voltage in the semiconductor light emitting device of the first exemplary embodiment according to the present invention.

Next, three (3) samples were produced by the above-described manufacturing method in which the average Zn concentration in the first p-type transparent conductive layer 17 was set to $5.0 \times 10^{17}$, $1.0 \times 10^{18}$, and $1.0 \times 10^{19}$ atoms/cm$^3$. The forward voltage (Vf) of each of the obtained samples was determined. The measurement results are shown in FIG. 13. It should be noted that the other parameters (including the thicknesses of the other semiconductor layers, the impurity concentrations thereof, and the like) were the same as the set values in the above-described manufacturing method. The abscissa in FIG. 13 represents the average Zn concentration in the first p-type transparent conductive layer 17 (atoms/cm$^3$), and the ordinate represents the forward voltage of the sample (V).

As shown in FIG. 13, the measurement results reveal that when the average Zn concentration in the first p-type transparent conductive layer 17 is in the range of $1.0 \times 10^{18}$ to $1.0 \times 10^{19}$ atoms/cm$^3$, the forward voltage hardly changes. The measurement results also reveal that in the case in which the average Zn concentration in the first p-type transparent conductive layer 17 is less than $1.0 \times 10^{18}$ atoms/cm$^3$, as the average Zn concentration in the first p-type transparent conductive layer 17 increases, the forward voltage rapidly decreases. Thus, the average Zn concentration in the first p-type transparent conductive layer 17 should be at least $1.0 \times 10^{18}$ atoms/cm$^3$ in view of the forward voltage of the semiconductor light emitting device.

Figure 14:
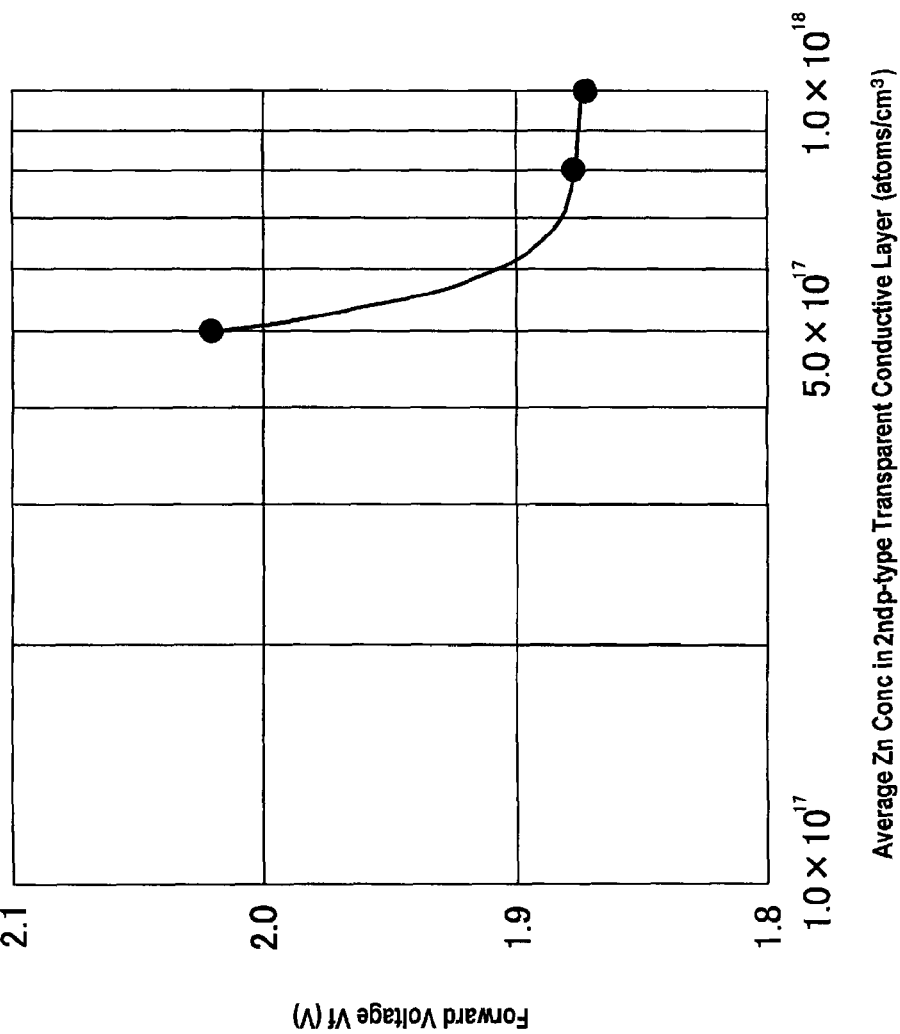
FIG. 14 is a graph showing the relationship between the average Zn concentration of the second p-type transparent conductive layer and the forward voltage in the semiconductor light emitting device of the first exemplary embodiment according to the present invention.

Next, three (3) samples were produced by the above-described manufacturing method in which the average Zn concentration in the second p-type transparent conductive layer 18 was set to $5.0 \times 10^{17}$, $8.0 \times 10^{17}$, and $1.0 \times 10^{18}$ atoms/cm$^3$. The forward voltage (Vf) of each of the obtained samples was determined. The measurement results are shown in FIG. 14. It should be noted that the other parameters (including the thicknesses of the other semiconductor layers, the impurity concentrations thereof, and the like) were the same as the set values in the above-described manufacturing method. The abscissa in FIG. 14 represents the average Zn concentration in the second p-type transparent conductive layer 18 (atoms/cm$^3$), and the ordinate represents the forward voltage of the sample (V).

As shown in FIG. 14, the measurement results reveal that when the average Zn concentration in the second p-type transparent conductive layer 18 is at least $7.0 \times 10^{17}$ atoms/cm$^3$, the forward voltage hardly changes. The measurement results also reveal that in the case in which the average Zn concentration in the second p-type transparent conductive layer 18 is less than $7.0 \times 10^{17}$ atoms/cm$^3$, as the average Zn concentration in the second p-type transparent conductive layer 18 increases, the forward voltage rapidly decreases. Thus, the average Zn concentration in the second p-type transparent conductive layer 18 should be at least $7.0 \times 10^{17}$ atoms/cm$^3$ in view of the forward voltage of the semiconductor light emitting device.

Figure 15:
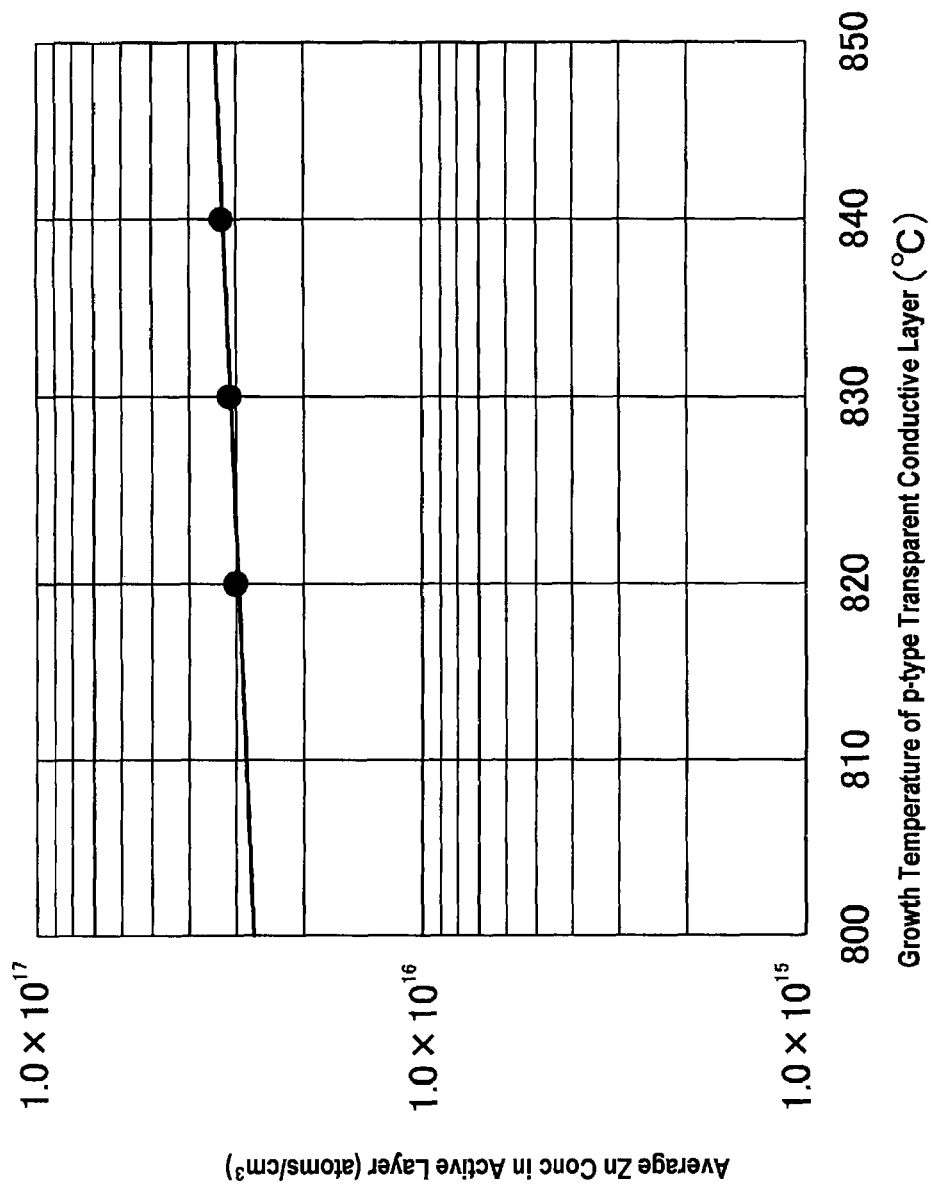
FIG. 15 is a graph showing the relationship between the growth temperature and the average Zn concentration in the active layer of the semiconductor light emitting device of the first exemplary embodiment according to the present invention.

Next, three (3) samples were produced by the above-described manufacturing method in which the growth temperature for the first to third p-type transparent conductive layers 17, 18 and 19 was set to 820° C., 830° C. and 840° C. The Zn concentration in the active layer 14 in each of the obtained samples was determined by a SIMS analysis. The measurement results are shown in FIG. 15. It should be noted that the other parameters (including the thicknesses of the other semiconductor layers, the impurity concentrations thereof, and the like) were the same as the set values in the above-described manufacturing method. The abscissa in FIG. 14 represents the growth temperature, and the ordinate represents the average Zn concentration in the active layer 14 (atoms/cm$^3$). The ordinate is scaled logarithmically.

As shown in FIG. 15, in the semiconductor light emitting device 10 of the present exemplary embodiment, even when the growth temperature is varied, the average Zn concentration in the active layer 14 was not changed.

In consideration of the experimental results, the thickness of the p-type intermediate layer 16 should be at least 20 nm and less than 100 nm, the thickness of the first p-type transparent conductive layer 17 should be at most 80 nm, the thickness of the second p-type transparent conductive layer 18 should be in the range of 200 nm to 1000 nm, and the thickness of the third p-type transparent conductive layer 19 should be in the range of 3 μm to 10 μm. In addition, the average Zn concentration in the first p-type transparent conductive layer 17 should be in the range of $1.0 \times 10^{18}$ to $1.0 \times 10^{19}$ atoms/cm$^3$, the average Zn concentration in the second p-type transparent conductive layer 18 should be in the range of $7.0 \times 10^{17}$ to $1.0 \times 10^{18}$ atoms/cm$^3$, and the average Zn concentration in the third p-type transparent conductive layer 19 should be in the range of $1.0 \times 10^{18}$ to $3.0 \times 10^{18}$ atoms/cm$^3$, However, when the average Zn concentration in the first p-type transparent conductive layer 17 is $1.0 \times 10^{19}$ atoms/cm$^3$ and the average Zn concentration in the third p-type transparent conductive layer 19 is $3.0 \times 10^{18}$ atoms/cm$^3$, the average Zn concentration in the second p-type transparent conductive layer 18 should be set to $8.0 \times 10^{17}$ atoms/cm$^3$ or less. Furthermore, the average Zn concentration in the p-type intermediate layer 16 can be set in the range of $1.0 \times 10^{17}$ to $1.0 \times 10^{19}$ atoms/cm$^3$ as it hardly contribute to the Zn concentration in the active layer 14. Accordingly, it is desired that the average Zn concentration in the diffusion control layer 40 should be at least $1.0 \times 10^{18}$ atoms/cm$^3$.

As described above, the semiconductor light emitting device of the present invention can have a structure in which, on the second cladding layer (which sandwiches the active layer together with the first cladding layer) the intermediate layer, the first transparent conductive layer, the second transparent conductive layer and the third transparent conductive layer are deposited sequentially in this order, with the third transparent conductive layer having a higher impurity concentration than the second transparent conductive layer. Furthermore, the intermediate layer and the first transparent conductive layer can constitute the diffusion control layer that control the impurity amount diffused from the second and third transparent conductive layers. In this instance, the diffusion control layer can have a higher impurity concentration than the second transparent conductive layer and a lattice mismatch interface.

The semiconductor light emitting device can have such a diffusion control layer and the second and third transparent conductive layers that can serve as an impurity source above the diffusion control layer. Accordingly, the forward voltage of the device can be reduced and the diffusion of impurities from the second and third transparent conductive layers can be controlled. This configuration can provide a high luminance and have a high reliability.

Further, the method for manufacturing a semiconductor light emitting device of the present invention can include: growing an n-type AlGaInP cladding layer, an undoped AlGaInP active layer, and a p-type AlGaInP cladding layer which is doped with Zn; depositing, on the p-type AlGaInP cladding layer, a p-type AlGaInP intermediate layer which is doped with Zn and has a thickness of at least 20 nm and a first transparent conductive layer which is made of GaInP doped with Zn in this order to grow a diffusion control layer having a total thickness of at most 100 nm; growing a second transparent conductive layer which is made of GaInP on the diffusion control layer, the second transparent conductive layer being doped with Zn in a concentration lower than a concentration of Zn in the diffusion control layer; and growing a third transparent conductive layer which is made of GaInP on the second transparent conductive layer, the third transparent conductive layer being doped with Zn in a concentration higher than the concentration of Zn in the second transparent conductive layer.

The provision of the diffusion control layer, as well as the thickness control and the Zn doping control in the respective transparent conductive layers can provide a semiconductor light emitting device with a high luminance and high reliability.

[Second Exemplary Embodiment]

In the first exemplary embodiment, the n-type GaAs substrate serving as a growth substrate remains in the semiconductor light emitting device as one of the constituents. However, the present invention is not limited to this configuration. The n-type GaAs substrate can be removed and a different supporting substrate may be pasted to the stack structure composed of the plurality of semiconductor layers. This semiconductor light emitting device and the manufacturing method thereof will be described as a second exemplary embodiment with reference to FIGS. 16 to 23.

First, a support substrate 201 composed of silicone (Si) with boron (B) added is prepared. Next, a first platinum (Pt) layer 202 and a second platinum (Pt) layer 203 are formed as metal layers on both surfaces of the support substrate 201 by an electron beam evaporation method (see FIG. 16B). Examples of the support substrate 201 include, not only silicon, but also GaP, quartz glass, sapphire, and the like.

Next, a titanium (Ti) layer 204 is formed on the second Pt layer 203 by the electron beam evaporation method. Further, a first nickel (Ni) layer 205 is formed on the Ti layer 204 by the electron beam evaporation method (see FIG. 16C).

Figure 16A:
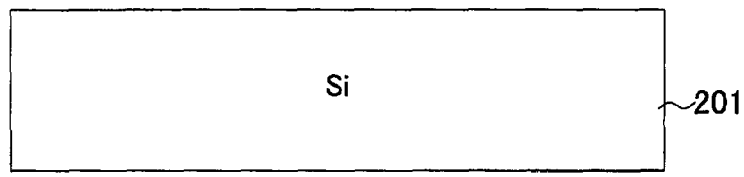
FIGS. 16A, 16B, 16C, and 16D are cross-sectional views illustrating steps of manufacturing the semiconductor light emitting device of a second exemplary embodiment according to the present invention.
Figure 16B:
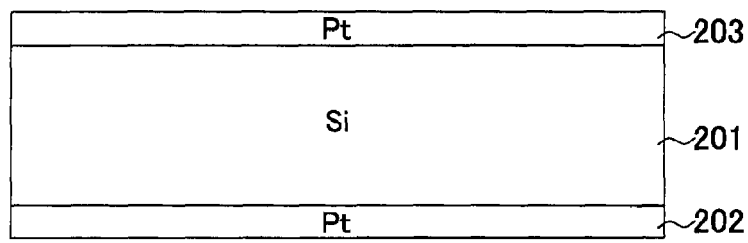
Figure 16C:
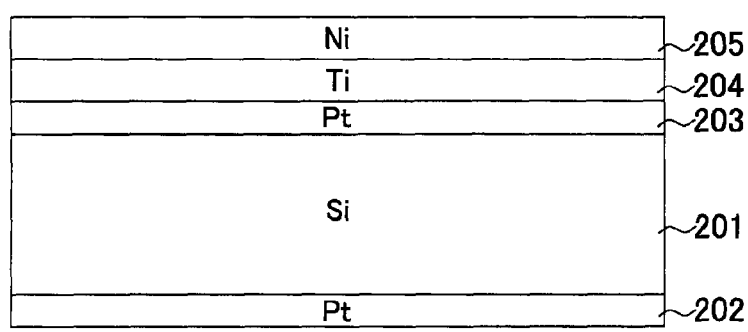
Figure 16D:
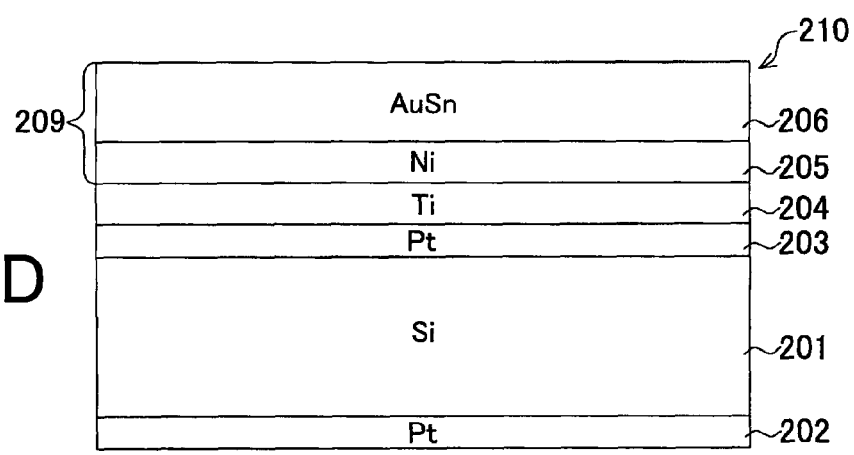

Then, an AuSn solder layer 206 is formed on the first Ni layer 205 by the electron beam evaporation method (see FIG. 16D). In this case, the ratio of Au and Sn in the AuSn solder layer 206 is approximately 8:2 in terms of weight and approximately 7:3 in terms of numbers of atoms. In the present exemplary embodiment, the first Ni layer 205 and the AuSn solder layer 206 can constitute a first jointing metal layer 209. This completes a supporting body 210.

Figure 17A:
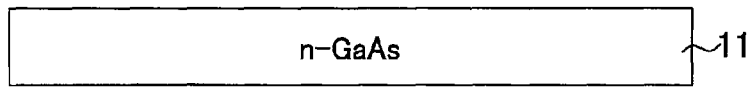
FIGS. 17A, 17B, 17C, 17D, and 17E are cross-sectional views illustrating steps of manufacturing the semiconductor light emitting device of the second exemplary embodiment according to the present invention.

Next, an n-type GaAs substrate 11 is prepared to serve as a growth substrate (see FIG. 17A). Then, by performing the MOCVD method on the n-type GaAs substrate 11, an n-type GaAs buffer layer 12, an n-type cladding layer 13, an active layer 14, a p-type cladding layer 15, a p-type intermediate layer 16, a first p-type transparent conductive layer 17, a second p-type transparent conductive layer 18, a third p-type transparent conductive layer 19, and a p-type contact layer 20 are sequentially formed. In this way, a semiconductor growth layer 214 can be formed on the n-type GaAs substrate 11 (see FIGS. 17B and 18).

Figure 17B:
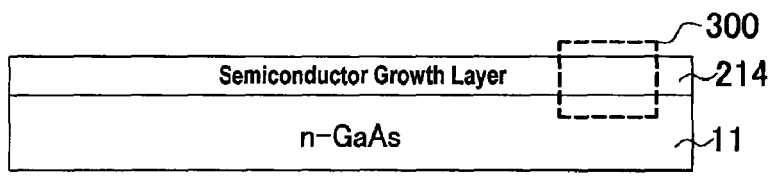
Figure 18:
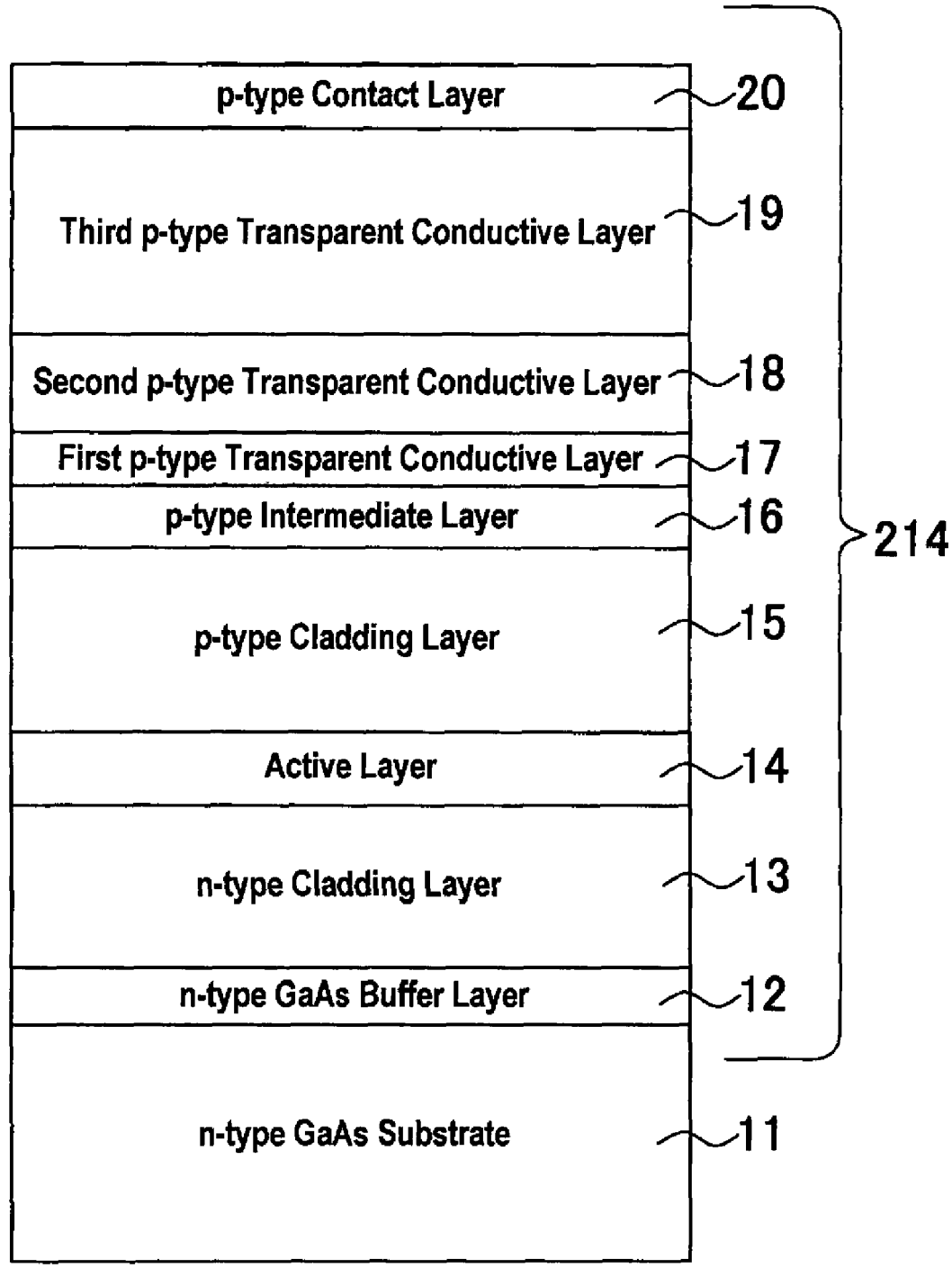
FIG. 18 is an enlarged view of the broken line area 300 of FIG. 17B.
Figure 19:
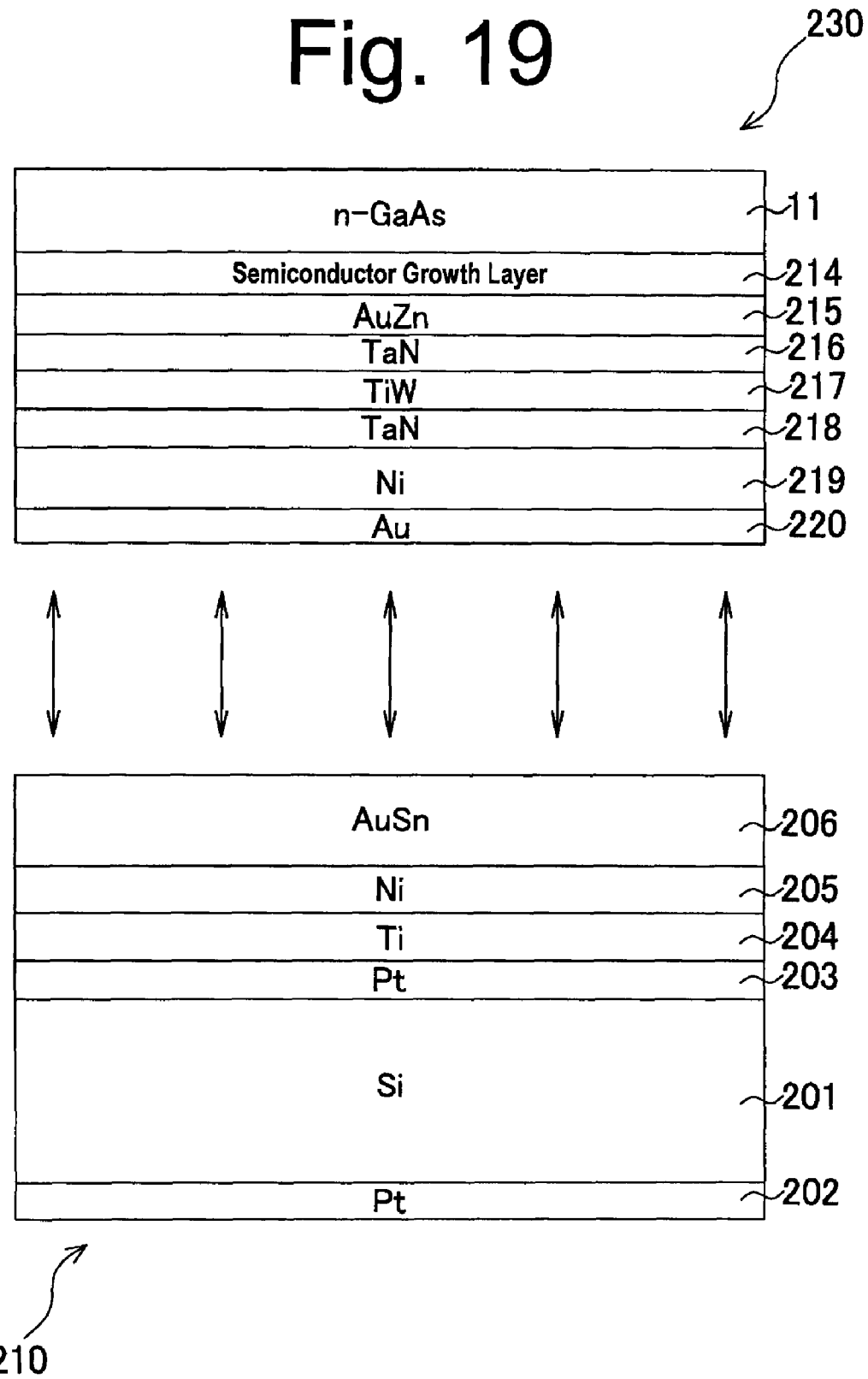
FIG. 19 is a cross-sectional view illustrating a step of manufacturing the semiconductor light emitting device of the second exemplary embodiment according to the present invention.
Figure 20:
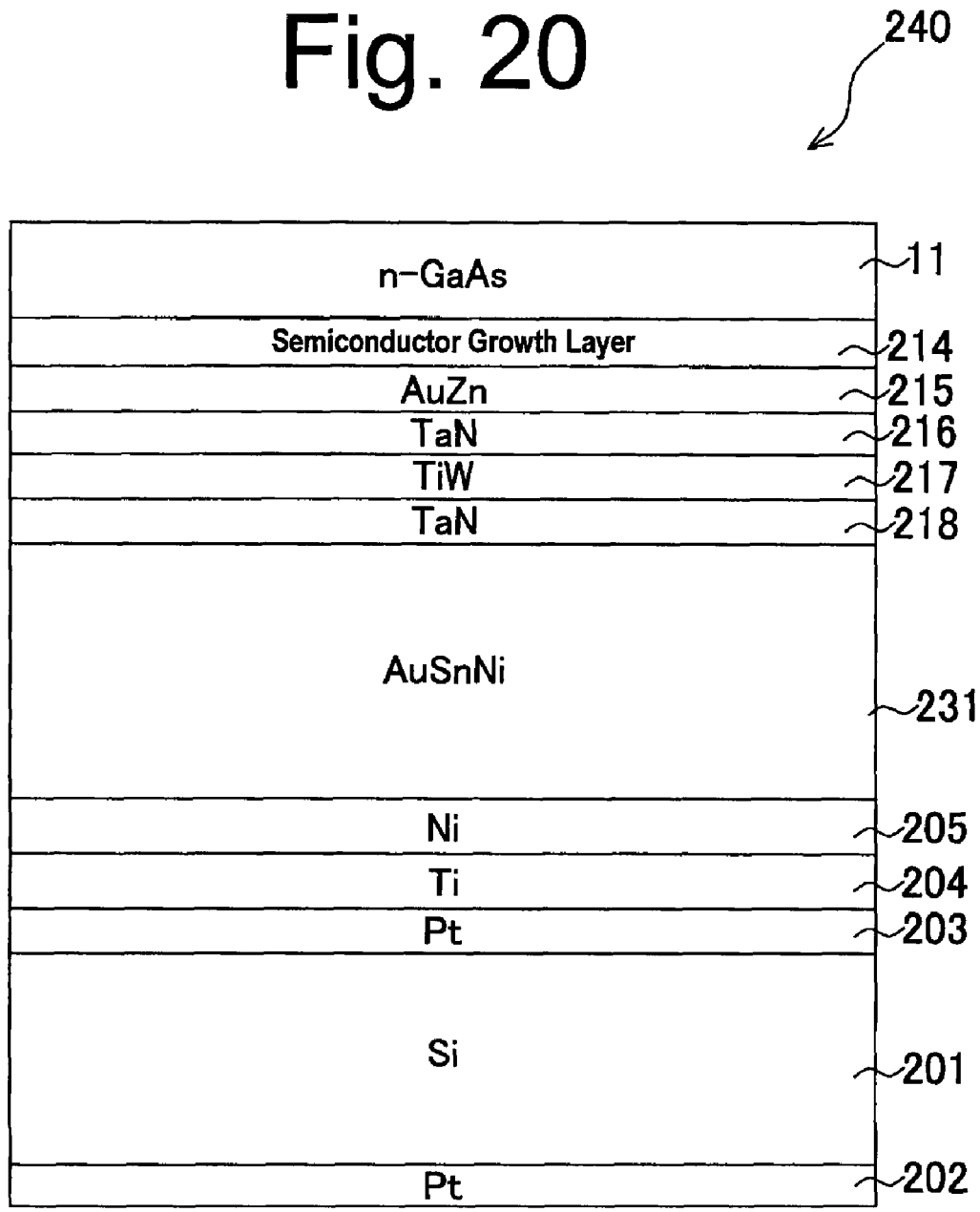
FIG. 20 is a cross-sectional view illustrating a step of manufacturing the semiconductor light emitting device of the second exemplary embodiment according to the present invention.

FIG. 18 is an enlarged view of the dotted lined area 300 in FIG. 17B. The semiconductor growth layer 214 has the same structure as in the first exemplary embodiment (except that it lacks the electrodes 21 and 22) (see FIG. 1), and is formed on the n-type GaAs substrate 11 in the same manner as in the first exemplary embodiment. Accordingly, a redundant description thereof is omitted here.

Figure 17C:
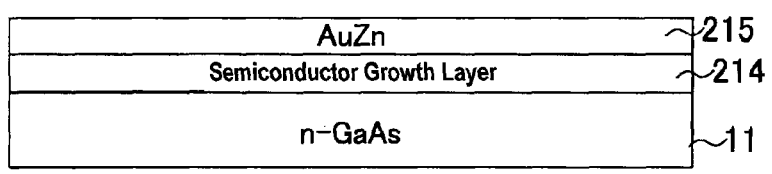
Figure 17D:
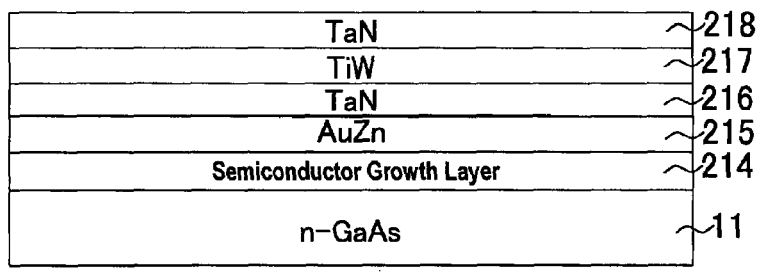
Figure 17E:
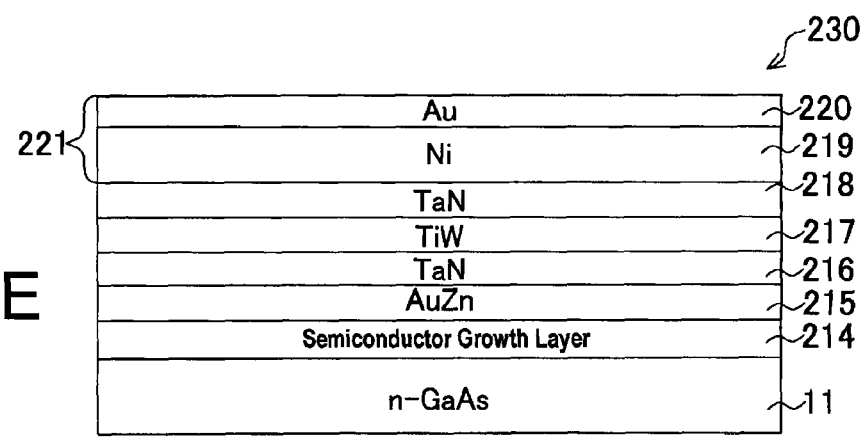

Next, a gold-zinc (AuZn) layer 215 is stacked on the semiconductor growth layer 214 by sputtering to serve as a reflective electrode layer (see FIG. 17C). The AuZn layer 215 can reflect light generated in the semiconductor growth layer 214 to the light output surface side. This configuration can improve the light output efficiency of the semiconductor light emitting device.

Then, a first tantalum nitride (TaN) layer 216 is formed on the AuZn layer 215 by a reactive sputtering method. Subsequently, a titanium-tungsten (TiW) layer 217 is formed on the first TaN layer 216 by the reactive sputtering method. Furthermore, a second TaN layer 218 is formed on the TiW layer 217 by the reactive sputtering method (see FIG. 17D). The first TaN layer 216, the TiW layer 217 and the second TaN layer 218 can together prevent the invasion of a jointing member (eutectic material) by diffusion into the AuZn layer 215.

Next, a second Ni layer 219 is formed on the second TaN layer 218 by the electron beam evaporation method. Further, an Au layer 220 is formed on the second Ni layer 219 by the electron beam evaporation method (see FIG. 17E). In the present exemplary embodiment, the second Ni layer 219 and the Au layer 220 can constitute a second jointing metal layer 221. This completes a light emission body 230.

Next, the supporting body 210 and the light emission body 230 are brought into close contact with each other while the AuSn solder layer 206 of the supporting body 210 and the Au layer 220 of the light emission body 230 face each other. The contacted supporting body 210 and light emission body 230 are subjected to thermal compression in a nitrogen atmosphere (see FIG. 19). The conditions for the thermal compression include, for example, a pressure of approximately 1 MPa, a temperature of approximately 340° C., and a compression time of approximately 10 minutes. This thermal compression can melt the AuSn solder layer 206, thereby dissolving the second Ni layer 219 and the Au layer 220 in the molten AuSn solder layer 206. Further, Au and Sn in the AuSn solder layer 206 and Au in the Au layer 220 can diffuse and be absorbed in the first Ni layer 205 and the second Ni layer 219. Then, the molten AuSn solder layer 206 is solidified to form a jointing layer 231 made of AuSnNi. In this way, the supporting body 210 and the light emission body 230 are joined together to form the jointing body 240.

Next, a wet etching is performed the jointing body 240 using a mixed liquid of aqueous ammonia and a hydrogen peroxide solution to remove the n-type GaAs substrate 11 from the jointing body 240. The removal of the n-type GaAs substrate 11 can expose the surface of the semiconductor growth layer 214 (see FIG. 21). It should be noted that the removal of the n-type GaAs substrate 11 can be achieved by other methods, such as dry etching, chemical mechanical polishing, mechanical polishing, or a combination of these.

Then, a resist is applied onto the semiconductor growth layer 214. The applied resist is then patterned to form a desired electrode pattern. The patterned resist is configured to have opening areas where AuGeNi is deposited by the electron beam evaporation method. After the deposition, the resist is removed to form an AuGeNi layer having a predetermined shape. Then, the AuGeNi layer and the jointing body 240 are subjected to thermal treatment at approximately 400° C. in a nitrogen atmosphere. This can form an alloy of the AuGeNi layer and the semiconductor growth layer 214, thereby completing the semiconductor growth layer 214 and an external connection electrode 232 forming an ohmic junction with the semiconductor growth layer 214. This completes the semiconductor light emitting device 200 (see FIG. 22).

Figure 22:
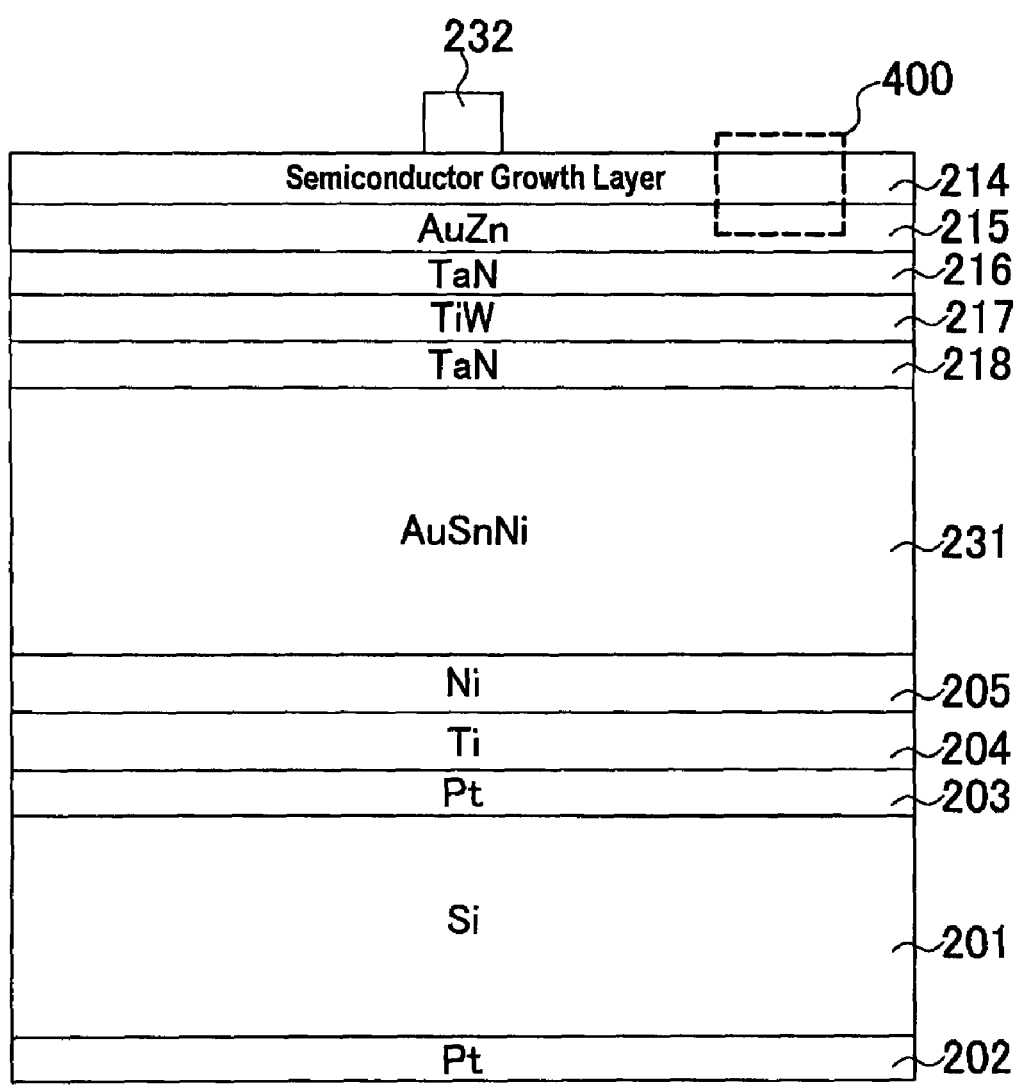
FIG. 22 is a cross-sectional view illustrating a step of manufacturing the semiconductor light emitting device of the second exemplary embodiment according to the present invention.
Figure 23:
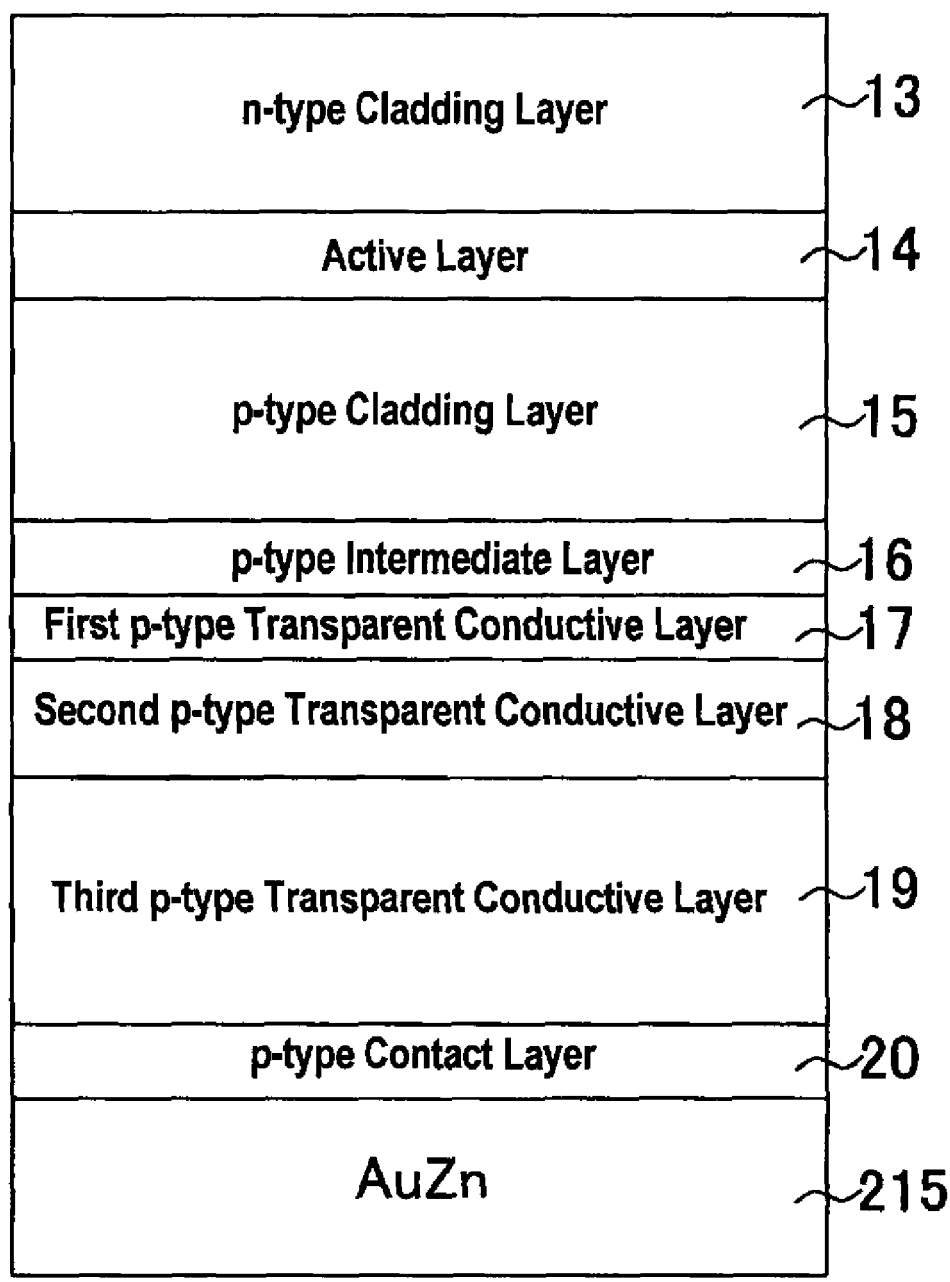
FIG. 23 is an enlarged view of the broken line area 400 of FIG. 22.

FIG. 23 is an enlarged view of the dotted lined area 400 in FIG. 22. As shown in FIG. 23, on the AuZn layer 215, the p-type contact layer 20, the third p-type transparent conduction layer 19, the second p-type transparent conduction layer 18, the first p-type transparent conduction layer 17, the p-type intermediate layer 16, the p-type cladding layer 15, the active layer 14, and the n-type cladding layer 13 are stacked in this order.

The semiconductor light emitting device 200 manufactured by the manufacturing method according to the present exemplary embodiment can provide the same advantageous effects as in the first exemplary embodiment as a result of the same experiments as in the first exemplary embodiment (the tests for the Zn concentration of the active layer 14 and for the forward voltage). This is because the method for forming the semiconductor growth layer 214 on the n-type GaAs substrate 11 before the pasting process is the same as that in the first exemplary embodiment. In other words, even if the process for removing the n-type GaAs substrate 11 and the process for pasting to a new supporting substrate (semiconductor substrate) are carried out after the formation of the semiconductor growth layer 214, a semiconductor light emitting device with a high luminance and high reliability can be achieved.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting device comprising:
a first cladding layer of a first conduction type;
a second cladding layer of a second conduction type;
an active layer of the second conduction type provided between the first cladding layer and the second cladding layer;
a diffusion control layer formed by sequentially stacking an intermediate layer of the second conduction type and a first transparent conductive layer of the second conduction type on the second cladding layer in this order, the intermediate layer being lattice matched with the first cladding layer;
a second transparent conductive layer of the second conduction type, provided on the diffusion control layer and having an impurity in a concentration lower than an impurity concentration of the diffusion control layer; and
a third transparent conductive layer of the second conduction type, provided on the second transparent conductive layer and having an impurity in a concentration higher than the impurity concentration of the second transparent conduction layer,
wherein a boundary between the intermediate layer and the first transparent conductive layer is a lattice mismatch interface.

2. The semiconductor light emitting device according to claim 1, wherein:
an impurity for the second conduction type is Zn;
each of the first cladding layer, the second cladding layer, and the active layer is made of AlGaInP;
the intermediate layer has a composition of $(Al_xGa_{1-x})_yIn_{1-y}P$ ($0.3 \leq x \leq 1$, $0 < y \leq 1$);
each of the first transparent conductive layer, the second transparent conductive layer, and the third transparent conductive layer has a composition of $Ga_xIn_{1-x}P$ ($0 < x \leq 1$); and
the diffusion control layer has a thickness of at most 100 nm.

3. The semiconductor light emitting device according to claim 2, wherein the diffusion control layer has an average Zn concentration of at least $1 \times 10^{18}$ atoms/cm$^3$.

4. The semiconductor light emitting device according to claim 2, wherein each of the first transparent conductive layer, the second transparent conductive layer, and the third transparent conductive layer contains 3% to 10% In.

5. The semiconductor light emitting device according to claim 3, wherein each of the first transparent conductive layer, the second transparent conductive layer, and the third transparent conductive layer contains 3% to 10% In.

6. The semiconductor light emitting device according to claim 2, wherein the active layer has an average Zn concentration of $2 \times 10^{16}$ to $4 \times 10^{16}$ atoms/cm$^3$.

7. The semiconductor light emitting device according to claim 3, wherein the active layer has an average Zn concentration of $2 \times 10^{16}$ to $4 \times 10^{16}$ atoms/cm$^3$.

8. The semiconductor light emitting device according to claim 4, wherein the active layer has an average Zn concentration of $2 \times 10^{16}$ to $4 \times 10^{16}$ atoms/cm$^3$.

9. The semiconductor light emitting device according to claim 5, wherein the active layer has an average Zn concentration of $2 \times 10^{16}$ to $4 \times 10^{16}$ atoms/cm$^3$.

10. The semiconductor light emitting device according to claim 2, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

11. The semiconductor light emitting device according to claim 3, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

12. The semiconductor light emitting device according to claim 4, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

13. The semiconductor light emitting device according to claim 5, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

14. The semiconductor light emitting device according to claim 6, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

15. The semiconductor light emitting device according to claim 7, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

16. The semiconductor light emitting device according to claim 8, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

17. The semiconductor light emitting device according to claim 9, wherein the first transparent conductive layer, the second transparent conductive layer, and the third transparent conductive layer have average Zn concentrations of $1 \times 10^{18}$ to $1 \times 10^{19}$ atoms/cm$^3$, $7 \times 10^{17}$ to $1 \times 10^{18}$ atoms/cm$^3$, and $1 \times 10^{18}$ to $3 \times 10^{18}$ atoms/cm$^3$, respectively.

18. The semiconductor light emitting device according to claim 10, wherein the average Zn concentration of the second transparent conductive layer is at most $8 \times 10^{17}$ atoms/cm$^3$.

19. The semiconductor light emitting device according to claim 11, wherein the average Zn concentration of the second transparent conductive layer is at most $8 \times 10^{17}$ atoms/cm$^3$.

20. The semiconductor light emitting device according to claim 12, wherein the average Zn concentration of the second transparent conductive layer is at most $8 \times 10^{17}$ atoms/cm$^3$.

21. The semiconductor light emitting device according to claim 14, wherein the average Zn concentration of the second transparent conductive layer is at most $8 \times 10^{17}$ atoms/cm$^3$.

22. The semiconductor light emitting device according to claim 2, wherein the first transparent conductive layer has a thickness of at most 80 nm, the second transparent conductive layer has a thickness of 200 nm to 1000 nm, and the third transparent conductive layer has a thickness of 3 μm to 10 μm.

23. The semiconductor light emitting device according to claim 3, wherein the first transparent conductive layer has a thickness of at most 80 nm, the second transparent conductive layer has a thickness of 200 nm to 1000 nm, and the third transparent conductive layer has a thickness of 3 μm to 10 μm.

24. The semiconductor light emitting device according to claim 4, wherein the first transparent conductive layer has a thickness of at most 80 nm, the second transparent conductive layer has a thickness of 200 nm to 1000 nm, and the third transparent conductive layer has a thickness of 3 μm to 10 μm.

25. The semiconductor light emitting device according to claim 6, wherein the first transparent conductive layer has a thickness of at most 80 nm, the second transparent conductive layer has a thickness of 200 nm to 1000 nm, and the third transparent conductive layer has a thickness of 3 μm to 10 μm.

26. The semiconductor light emitting device according to claim 10, wherein the first transparent conductive layer has a thickness of at most 80 nm, the second transparent conductive layer has a thickness of 200 nm to 1000 nm, and the third transparent conductive layer has a thickness of 3 μm to 10 μm.

27. The semiconductor light emitting device according to claim 18, wherein the first transparent conductive layer has a thickness of at most 80 nm, the second transparent conductive layer has a thickness of 200 nm to 1000 nm, and the third transparent conductive layer has a thickness of 3 μm to 10 μm.

* * * * *